(12) United States Patent
Palmers et al.

(10) Patent No.: US 10,721,110 B2
(45) Date of Patent: Jul. 21, 2020

(54) ERROR-COMPENSATED DIRECT DIGITAL MODULATION DEVICE

(71) Applicant: Huawei Technologies Co., Ltd., Shenzhen (CN)

(72) Inventors: Pieter Palmers, Munich (DE); Niels Christoffers, Munich (DE); Patrick Vandenameele, Leuven (BE); Johannes Samsom, Munich (DE); Koen Cornelissens, Leuven (BE); Sofia Vatti, Leuven (BE)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/905,228

(22) Filed: Feb. 26, 2018

(65) Prior Publication Data
US 2018/0198661 A1 Jul. 12, 2018

Related U.S. Application Data

(63) Continuation of application No. PCT/EP2016/051023, filed on Jan. 19, 2016.

(51) Int. Cl.
*H04L 27/26* (2006.01)
*H03M 1/10* (2006.01)
(Continued)

(52) U.S. Cl.
CPC ...... *H04L 27/2627* (2013.01); *H03M 1/1047* (2013.01); *H04B 1/123* (2013.01);
(Continued)

(58) Field of Classification Search
CPC ........ H03M 3/50; H03M 1/06; H03M 1/0602; H03M 1/0854; H03M 1/1038; H03M 1/1042; H04B 1/0475
See application file for complete search history.

(56) References Cited

U.S. PATENT DOCUMENTS

| 4,465,996 A | 8/1984 | Boyacigiller et al. |
| 5,663,691 A * | 9/1997 | Kowalik ............. H04L 27/2071 |
| | | 332/103 |

(Continued)

FOREIGN PATENT DOCUMENTS

| CN | 1223506 A | 7/1999 |
| CN | 1487497 A | 4/2004 |

(Continued)

OTHER PUBLICATIONS

Alavi, M.S. et al., "A Wideband 2×13-Bit All-Digital I/Q RF-DAC," IEEE Transactions on Microwave Theory and Techniques, vol. 62, No. 4, Apr. 2014, pp. 732-752.

(Continued)

*Primary Examiner* — Edward F Urban
*Assistant Examiner* — Rui M Hu
(74) *Attorney, Agent, or Firm* — Slater Matsil, LLP

(57) ABSTRACT

The disclosure relates to an error-compensated direct digital modulation device, including: a direct digital radio frequency modulator (DDRM), configured to generate a radio frequency (RF) signal based on a modulation of a digital baseband signal; an error estimator configured to determine an error signal resulting from a deviation based on the generated RF signal and a representation of the digital baseband signal; and an error compensator configured to subtract the error signal from the RF signal to provide an error compensated RF signal.

21 Claims, 25 Drawing Sheets

(51) Int. Cl.

| | | |
|---|---|---|
| *H04L 27/36* | (2006.01) | |
| *H04B 1/12* | (2006.01) | |
| *H04L 27/12* | (2006.01) | |
| *H04L 25/03* | (2006.01) | |
| *H03M 1/66* | (2006.01) | |
| *H04B 1/00* | (2006.01) | |

(52) U.S. Cl.
CPC .......... *H04L 27/122* (2013.01); *H04L 27/368* (2013.01); *H03M 1/66* (2013.01); *H04B 1/0007* (2013.01); *H04L 25/03* (2013.01)

(56) References Cited

U.S. PATENT DOCUMENTS

| | | | | |
|---|---|---|---|---|
| 5,684,487 | A | | 11/1997 | Timko |
| 5,883,551 | A | * | 3/1999 | Marchesani .......... H04L 27/364 332/103 |
| 5,959,500 | A | * | 9/1999 | Garrido ................ H03F 1/3223 330/151 |
| 5,977,899 | A | * | 11/1999 | Adams .................... H03M 3/50 341/143 |
| 6,400,774 | B1 | | 6/2002 | Matsuoka et al. |
| 7,027,532 | B2 | * | 4/2006 | Lauer ................ H03M 13/3723 375/261 |
| 7,877,076 | B2 | * | 1/2011 | Walkington ........... H03C 3/406 455/323 |
| 8,395,453 | B2 | * | 3/2013 | Chang .................... H03L 7/085 327/150 |
| 9,020,027 | B2 | * | 4/2015 | Staszewski ........... H03F 3/2176 330/10 |
| 2002/0085647 | A1 | * | 7/2002 | Oishi .................... H03F 1/3247 375/297 |
| 2003/0202614 | A1 | * | 10/2003 | Braithwaite .......... H03F 1/3294 375/296 |
| 2004/0076339 | A1 | | 4/2004 | Park et al. |
| 2005/0129140 | A1 | * | 6/2005 | Robinson .............. H03F 1/3223 375/297 |
| 2006/0291589 | A1 | * | 12/2006 | Eliezer ..................... H03C 3/40 375/302 |
| 2007/0165745 | A1 | | 7/2007 | Fonden et al. |
| 2007/0262827 | A1 | * | 11/2007 | Walkington ........... H03C 3/406 332/150 |
| 2009/0054018 | A1 | * | 2/2009 | Waheed ................ H03G 3/3047 455/126 |
| 2014/0064406 | A1 | * | 3/2014 | Onishi .................. H04L 27/361 375/297 |
| 2014/0266834 | A1 | * | 9/2014 | Bruennert ............. H03M 1/685 341/145 |
| 2014/0348265 | A1 | | 11/2014 | Wang et al. |
| 2014/0369442 | A1 | | 12/2014 | Huang |
| 2015/0009058 | A1 | * | 1/2015 | Nentwig .................. H03M 3/50 341/144 |
| 2015/0042310 | A1 | * | 2/2015 | Gazsi ..................... G04D 7/003 324/76.24 |
| 2015/0139354 | A1 | * | 5/2015 | Ylamurto ............. H04B 1/0475 375/296 |
| 2017/0317686 | A1 | * | 11/2017 | Dartois ..................... H03F 3/24 |

FOREIGN PATENT DOCUMENTS

| | | |
|---|---|---|
| CN | 1954491 A | 4/2007 |
| CN | 102130697 A | 7/2011 |
| EP | 1359719 A2 | 11/2003 |

OTHER PUBLICATIONS

Jerng, A. et al., "A Wideband ΔΣ Digital-RF Modulator for High Data Rate Transmitters," IEEE Journal of Solid-State Circuits, vol. 42, No. 8, Aug. 2007, pp. 1710-1722.

Katz, A., "Linearization: Reducing Distortion in Power Amplifiers," IEEE Microwave Magazine, vol. 2, No. 4, Dec. 1, 2001, pp. 37-49.

Luschas, S. et al., "Radio Frequency Digital-to-Analog Converter," IEEE Journal of Solid State Circuits, vol. 39, No. 3, Sep. 2004, pp. 1462-1467.

Luschas, S. et al., "A 942 MHz Output, 17.5 MHz Bandwidth, −70dBc IMD3 ΣΔ DAC," Proceedings of the 2003 IEEE Custom Integrated Circuits Conference, Sep. 21-24, 2003, pp. 131- 134.

Su, S. et aL, "A 12 bit 1 GS/s Dual-Rate Hybrid DAC With an 8 GS/s Unrolled Pipeline Delta-Sigma Modulator Achieving > 75 dB SFDR Over the Nyquist Band," IEEE Journal of Solid State Circuits, vol. 50, No. 4, Apr. 2015, pp. 396-907.

Tang, Y. et al., "A 14 bit 200 MS/s DAC With SFDR >78 dBc, IM3 <-83 dBc and NSD <-163 dBm/Hz Across the Whole Nyquist Band Enabled by Dynamic-Mismatch Mapping," IEEE Journal of Solid State Circuits, vol. 46, No. 6, Jun. 2011,pp. 1371-1381.

Ma, X. et al., "A Compensation Method of Quantizing Error and Its Circuits Implementation for Fixed-Width Multiplier," Journal of Xi'an Jiaotong University, vol. 45, No. 12, Dec. 2011, 7 pages.

Mohr, B. et al., "Analysis of Digital Predistortion Architectures for Direct Digital-to-RF Transmitter Systems," 2012 IEEE 55th International Midwest Symposium on Circuits and Systems (MWSCAS), Sep. 5, 2012, pp. 650-653.

\* cited by examiner

ERROR-COMPENSATED DIRECT DIGITAL MODULATION DEVICE

CROSS-REFERENCE TO RELATED APPLICATIONS

This application is a continuation of International Application No. PCT/EP2016/051023, filed on Jan. 19, 2016, which is hereby incorporated by reference in its entirety.

TECHNICAL FIELD

The present disclosure relates to an error-compensated direct digital modulation device (DDRM) and a method for providing an error-compensated radio frequency (RF) signal based on a digital baseband signal.

BACKGROUND

A Direct-Digital RF Modulator is a wireless transmitter circuit that directly modulates a digital baseband signal onto an RF carrier frequency. This is done by multiplying the baseband signal with a signal that contains a strong frequency component at the desired RF frequency (also referred to as the Local Oscillator).

FIG. 1 illustrates the conventional quadrature up-converter chain 100. In most modern transmitters the starting point is baseband data (I,Q) in a digital representation. This digital baseband data is converted into an analog equivalent signal by a baseband Digital-to-Analog converter (DAC) 101. It is followed by a reconstruction filter 103 that is then used to remove the artifacts due to the digital nature of the source signal such as aliases and quantization noise. Furthermore, the filter removes all effects of non-idealities from the D/A converter itself, e.g. mismatch noise, thermal noise and out-of-band distortion components that fall outside of the filter bandwidth. The filtered signal is then applied to the quadrature mixer 105 that performs a multiplication with the Local Oscillator (LO). The resulting RF signal is then amplified with an amplification stage 107, 109 that consists of one or more amplifiers, eventually delivering the power to the antenna 111.

A conceptual representation of the up-conversion and amplification stage 200 is shown in FIG. 2. The analog baseband signal is shown by the graph 201 (in-phase) and the graph 202 (quadrature). The solid line represents the positive signal in a differential signal pair, while the dashed lines are the opposite sign. One way to implement an up-conversion operation of such a baseband signal with a given LO having frequency FLO is to split the LO period into 4 equal parts, each with a length of T4LO=0.25/FLO. It can be shown that alternating between the positive in-phase 201, positive quadrature 202, negative in-phase 203 and negative quadrature 204 signals in one LO period will implement an up-conversion of the complex baseband signal to the LO frequency. The RF output 205 of such a mixer can then be fed into an amplifier that is biased 206 e.g. in Class-AB operation.

FIG. 3 shows a block diagram illustrating a DDRM based transmitter 300. The DDRM differs from a traditional quadrature up-conversion chain by the fact that the digital signal is first mixed 307 to LO and then recombined into an RF signal. First the digital baseband signal (I, Q) is digitally up-sampled 301 and digitally filtered 303 to ensure proper quantization noise performance and sufficient alias distance. Afterwards it is applied directly to the DDRM 305 that combines the functions of the DAC, mixer and first amplification stage. The DDRM 305 basically is a combination of several weighted slices consisting of a mixer and a power generation block. Based upon the magnitude of the baseband data a number of these slices are enabled in such a way that the signal presented to the antenna 311 corresponds to the desired signal.

As illustrated by FIG. 4 the output waveforms 400 can be very similar to those of a traditional TX. The analog baseband signal is shown by the graphs 401 (positive in-phase), 402 (negative in-phase), 403 (positive quadrature) and 404 (negative quadrature).

The transmitter output over time can also be represented as a trajectory 504 through the baseband equivalent constellation diagram 500 in which every point represents a state of the transmitter in time as indicated in FIG. 5. Points 501 represent the quantized ideal DDRM constellation points; points 502 represent the baseband constellation points and points 503 represent the sampled trajectory points. The generation of a modulated signal can be represented by following a certain trajectory over time, as indicated by the line 504. An ideal transmitter traverses such a trajectory with infinite precision and infinitesimal small time steps. In a time discrete, amplitude continuous transmitter the change in state happens at regular time intervals as shown by the crossed circles 503 that represent the sampled trajectory points in such a transmitter. Such a transmitter can still take on any state required, but it can only change from one state to another at specific points in time. The analog voltage sampling TX described before is such a transmitter. It has a continuous set of amplitude states for both I (in-phase) and Q (quadrature) signals, but the transition between one (I, Q) pair to the next happens only every LO period. A DDRM is not only time discrete, but also amplitude discrete and hence the set of available states is discrete as indicated by the grid of circles 503. In a DDRM the sampled trajectory point is rounded to the nearest available constellation point 502 resulting in an error vector 505. This error vector 505 is the quantization error in the DDRM.

In addition to the quantization error the imperfect manufacturing will make that the effective state of the DDRM will be slightly different than the expected state as illustrated in FIG. 6. The constellation point 602 generated by a DDRM for a given state configuration will differ for each manufactured device from the ideal DDRM constellation point 601. This yields an additional error vector that is the mismatch error.

Aside from the mismatch errors the constellation diagram 700 can also be distorted by compression as illustrated in FIG. 7 showing DDRM constellation points 701 affected by INL and compression. Compression is not a problem specific to the DDRM, but is a more common problem shared by all transmitters.

As shown above, degradation of accuracy in a Direct-Digital RF Modulator (DDRM) is due to quantization errors, unit element mismatch errors, sign swapper induced distortion, harmonic distortion, predistortion artifacts, layout induced mismatches (e.g. process gradients), layout induced distortion (e.g. non-zero delay) etc. These accuracy degradation mechanisms result amongst others in increased noise levels. Especially outside of the desired transmit signal spectrum this can be problematic as it might cause violation of spectral emission requirements or system specifications. The receive band of an FDD (frequency domain duplex) system in particular is a problematic spectral region as the receiver is desensitized reducing the usable operation range of the transceiver.

SUMMARY

It is the object of the invention to provide a design technique for a Direct-Digital RF Modulator (DDRM) with improved accuracy, in particular with respect to the degradation effects as described above.

This object is achieved by the features of the independent claims. Further implementation forms are apparent from the dependent claims, the description and the figures.

A basic idea of the invention is to mitigate the spectral impurities generated by an implementation of the Direct-Digital RF Modulator (DDRM) by using a feed-forward error compensation path that my include a digital-to-analog converter (DAC) also referred to as the "Error DAC". Essentially the concept is to compensate the non-ideal effects specifically introduced by the digital nature of a Direct-Digital-to-RF-modulator by feeding forward an estimate of these errors using a high-speed digital-to-analog converter.

In order to describe the invention in detail, the following terms, abbreviations and notations will be used:
RF: Radio Frequency
DDRM: Direct-Digital RF Modulator
DDRAM: Direct-Digital RF Amplitude Modulator
ADC: Analog-to-Digital Converter
DAC: Digital-to-Analog Converter
SAR: Successive Approximations Register
LSB: Least Significant Bit
MSB: Most Significant Bit
INL: integral nonlinearity
DNL: differential nonlinearity
I: In-phase component
Q: Quadrature component
LO: Local Oscillator
ErrorDAC: Error feed-forward path with DAC According to a first aspect, embodiments of the present invention relate to an error-compensated direct digital modulation device. The device includes a direct digital radio frequency modulator (DDRM), configured to generate a radio frequency (RF) signal based on a modulation of a digital baseband signal. The device also includes an error estimator configured to determine an error signal resulting from a deviation based on the generated RF signal and a representation of the digital baseband signal. The device also includes an error compensator configured to subtract the error signal from the RF signal to provide an error compensated RF signal.

Such a device provides a design technique for a Direct-Digital RF Modulator with improved accuracy. In contrast to other techniques the concept is not based on avoiding the generation of the error by changing the input value to closer match the desired output value, as is e.g. the concept of predistortion. Instead, the error is compensated by using a model of the error generation mechanism. Of course this can be advantageously combined with pre-distortion to reduce the dynamic range requirements of the compensation path but this is not required. The concept as such can be generally applied for improving the accuracy of data-converted signals, for example analog signals generated by Digital-to-Analog converters or output signals of other data converters. The concept is not limited to an RF signal that is output from a DDRM.

In a first possible implementation form of the device according to the first aspect, the error estimator is configured to determine the error signal based on a quantization error between the digital baseband signal and the RF signal.

This provides the advantage that the error-compensated direct digital modulation device may compensate the effects of the quantization error to increase its accuracy.

In a second possible implementation form of the device according to the first implementation form of the first aspect, the error estimator is configured to determine the quantization error based on Least Significant Bits (LSBs) in the digital baseband signal that are not used by the DDRM.

This provides the advantage that the error-compensated direct digital modulation device can easily determine the quantization error by providing the digital baseband signal with a higher resolution than a resolution used for the DDRM.

In a third possible implementation form of the device according to the first aspect as such or according to any of the preceding implementation forms of the first aspect, the error estimator is configured to determine the error signal based on a mismatch error resulting from a systematic deviation of the DDRM from its nominal output signal characteristic.

This provides the advantage that the device uses all errors instead of just the quantization error when generating a forward error-correction signal. This results in improved accuracy.

In a fourth possible implementation form of the device according to the third implementation form of the first aspect, the mismatch error corresponds to a known deviation of a signal constellation used by the DDRM from its nominal signal pattern, in particular a nominal signal pattern that is provided from a calibration procedure.

This provides the advantage that the known deviation can be computed in advance, e.g. during a factory calibration. Then the mismatch error can be efficiently computed.

In a fifth possible implementation form of the device according to the first aspect as such or according to any of the preceding implementation forms of the first aspect, the DDRM is configured to generate an analog RF signal; and the error estimator is configured to determine the error signal resulting from a deviation based on the generated analog RF signal and an analog representation of the digital baseband signal.

This provides the advantage that the error signal can be efficiently determined in the analog domain.

In a sixth possible implementation form of the device according to the first aspect as such or according to any of the preceding implementation forms of the first aspect, the error-compensated direct digital modulation device further comprises: one of a digital-to-analog converter (DAC) or a second DDRM configured to provide the error signal as an analog error signal.

This provides the advantage that the compensation path including the DAC or the second DDRM can have the same or a different architecture than the DDRM, increasing the design freedom.

In a seventh possible implementation form of the device according to the sixth implementation form of the first aspect, the error-compensated direct digital modulation device comprises a noise shaper, configured to noise shape the error signal before providing it to the one of the DAC or the second DDRM.

This provides the advantage that noise can be shifted to frequency bands that are not essential for data signal processing. Hence, SNR can be improved.

In an eighth possible implementation form of the device according to the sixth or the seventh implementation form of the first aspect, the one of the DAC or the second DDRM are configured to operate on a sample rate that is higher than a local oscillator (LO) frequency of the DDRM, in particular a sample rate that is equal to four times the LO frequency.

This provides the advantage that the compensation path can run at an unrelated rate to the main DDRM, increasing the design freedom.

In a ninth possible implementation form of the device according to any of the sixth to the eighth implementation forms of the first aspect, the one of the DAC or the second DDRM is configured to provide the error signal by using a first clock signal; and the DDRM is configured to modulate the digital baseband signal by using a second clock signal that is derived from the first clock signal, in particular by a clock divider.

This provides the advantage that DAC and DDRM can be operated at different rates which provides design flexibility.

In a tenth possible implementation form of the device according to the ninth implementation form of the first aspect, the error-compensated direct digital modulation device comprises: a quadrature clock generator configured to generate a first differential input clock signal and a second differential input clock signal based on the second clock signal, wherein the first differential input clock signal and the second differential input clock signal have orthogonal phases.

This provides the advantage that by using orthogonal phases a quadrature DDRM can be efficiently implemented.

In an eleventh possible implementation form of the device according to the tenth implementation form of the first aspect, the DDRM comprises: a first sign swapper configured to swap a phase of the first differential input clock signal based on a first control signal; and a second sign swapper configured to swap a phase of the second differential input clock signal based on a second control signal.

This provides the advantage that by using sign swappers differential phase architectures can be efficiently implemented.

In a twelfth possible implementation form of the device according to the tenth of the eleventh implementation form of the first aspect, the DDRM comprises: a first direct digital RF amplitude modulator configured to generate a first differential current based on a first magnitude control signal derived from the digital baseband signal and based on the first differential input clock signal; a second direct digital RF amplitude modulator configured to generate a second differential current based on a second magnitude control signal derived from the digital baseband signal and based on the second differential input clock signal; and a controller configured to provide the first magnitude control signal and the second magnitude control signal based on the digital baseband signal.

This provides the advantage that the two DDRAMs can have the same (chip) design. This structure facilitates the hardware design of the full DDRM because synergies can be exploited.

In a thirteenth possible implementation form of the device according to the twelfth implementation form of the first aspect, the error-compensated direct digital modulation device comprises a signal combiner configured to combine the first differential current, the second differential current and an inverse differential current generated by the one of the DAC and the second DDRM to provide the error compensated RF signal.

This provides the advantage that a signal subtraction can be easily implemented by combining the different signal paths, e.g. by direct connection of these signal paths.

According to a second aspect, embodiments of the present invention relate to a method for providing an error-compensated RF signal based on a digital baseband signal. The method includes generating a radio frequency (RF) signal based on a modulation of a digital baseband signal by using a direct digital radio frequency modulator (DDRM). The method also includes determining an error signal resulting from a deviation based on the generated RF signal and a representation of the digital baseband signal. The method also includes subtracting the error signal from the RF signal to provide an error compensated RF signal.

Such a method provides a design technique for providing an error-compensated RF signal with improved accuracy. In contrast to other techniques this concept is not based on avoiding the generation of the error by changing the input value to closer match the desired output value, as is e.g. the concept of predistortion. Instead, the error is compensated by using a model of the error generation mechanism. Of course this can be advantageously combined with predistortion to reduce the dynamic range requirements of the compensation path but this is not required. The concept as such can be generally applied for improving the accuracy of data-converted signals, for example analog signals generated by Digital-to-Analog converters or output signals of other data converters. The concept is not limited to an RF signal that is output from a DDRM.

BRIEF DESCRIPTION OF THE DRAWINGS

Further embodiments of the invention will be described with respect to the following figures, in which.

DETAILED DESCRIPTION OF ILLUSTRATIVE EMBODIMENTS

In the following detailed description, reference is made to the accompanying drawings, which form a part thereof, and in which is shown by way of illustration specific aspects in which the disclosure may be practiced. It is understood that other aspects may be utilized and structural or logical changes may be made without departing from the scope of the present disclosure. The following detailed description, therefore, is not to be taken in a limiting sense, and the scope of the present disclosure is defined by the appended claims.

It is understood that comments made in connection with a described method may also hold true for a corresponding device or system configured to perform the method and vice versa. For example, if a specific method step is described, a corresponding device may include a unit to perform the described method step, even if such unit is not explicitly described or illustrated in the figures. Further, it is understood that the features of the various exemplary aspects described herein may be combined with each other, unless specifically noted otherwise.

In the following devices and method are described that use quantization errors. Quantization is the process of mapping a large set of input values, e.g. analog data to a countable smaller set, e.g. to a set of digital values. Examples of quantization processes are rounding and truncation operations. The quantization error is the difference between an input value and its quantized value, e.g. the round-off error or the truncation error. A quantizer is a device that performs quantization. Examples of quantizers are analog-to-digital converters or DDRAMs.

Figure 8:
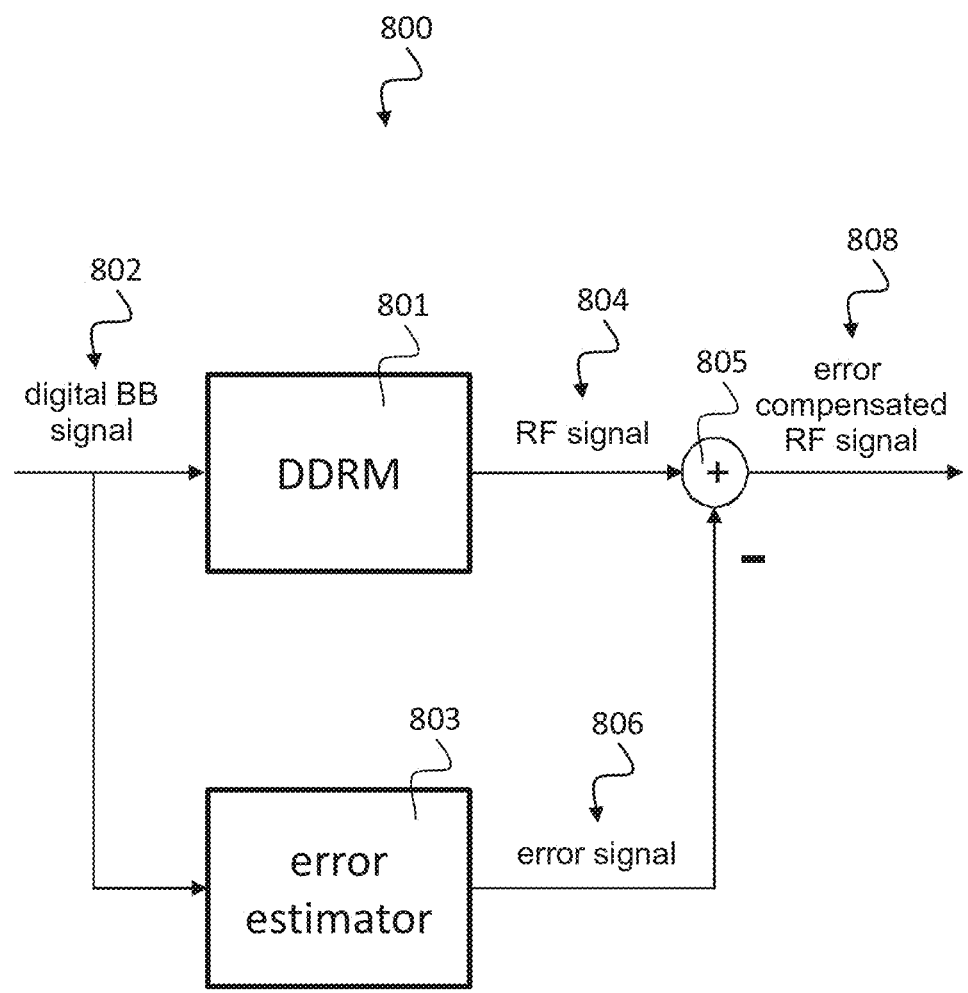
FIG. 8 shows a block diagram illustrating an error-compensated direct digital modulation device according to an implementation form.

FIG. 8 shows a block diagram illustrating an error-compensated direct digital modulation device 800 according to an implementation form.

The error-compensated direct digital modulation device 800 includes a direct digital radio frequency modulator (DDRM) 800 that generates a radio frequency RF signal 804 based on a modulation of a digital baseband signal 802. The error-compensated direct digital modulation device 800 further includes an error estimator 803 that determines an error signal 806 resulting from a deviation based on the generated RF signal 804 and a representation of the digital baseband signal 802. The error-compensated direct digital modulation device 800 further includes an error compensator that subtracts the error signal 806 from the RF signal 804 to provide an error compensated RF signal 808.

Figure 1:
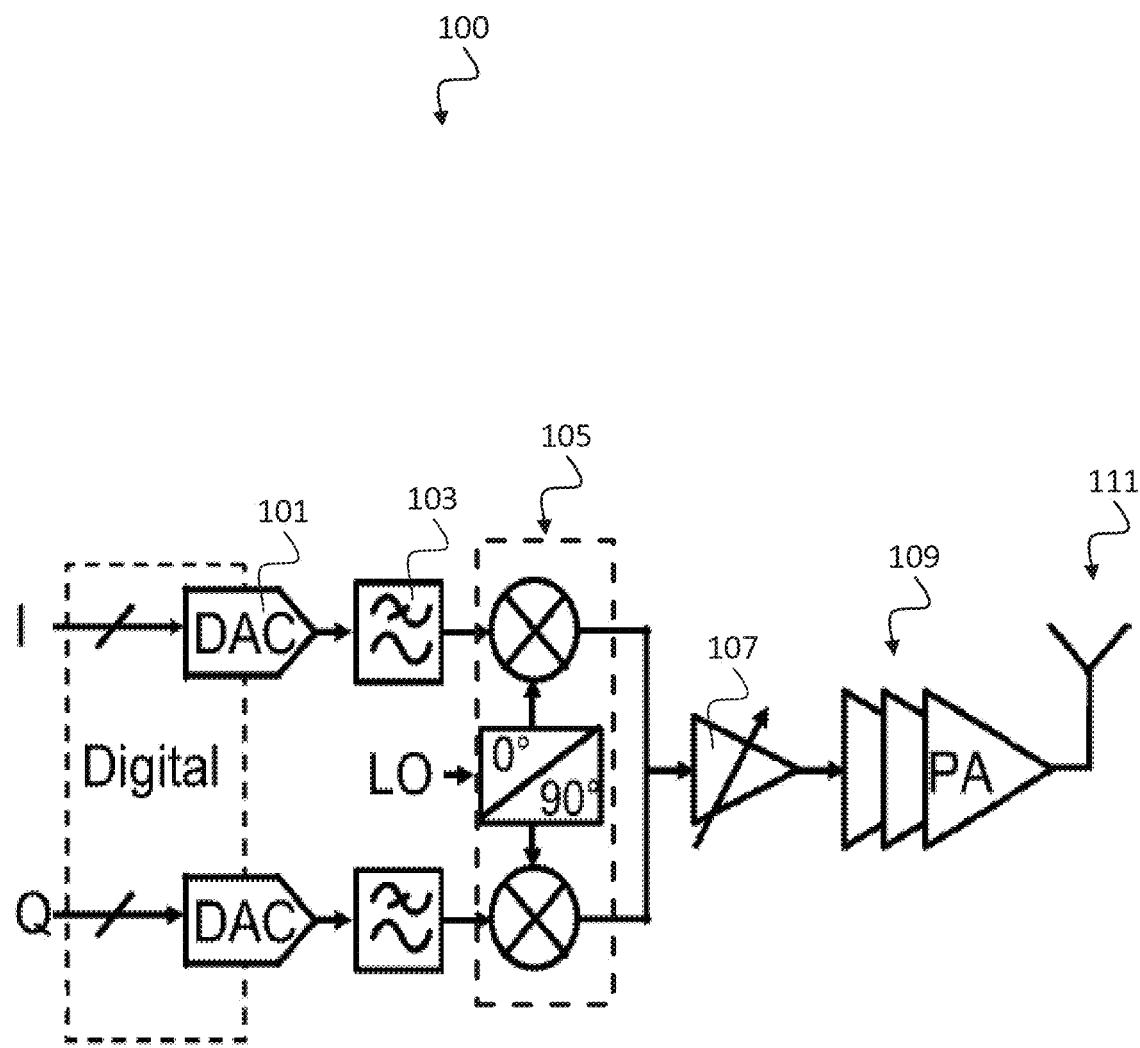
FIG. 1 shows a block diagram illustrating an analog quadrature up-converter.
Figure 2:
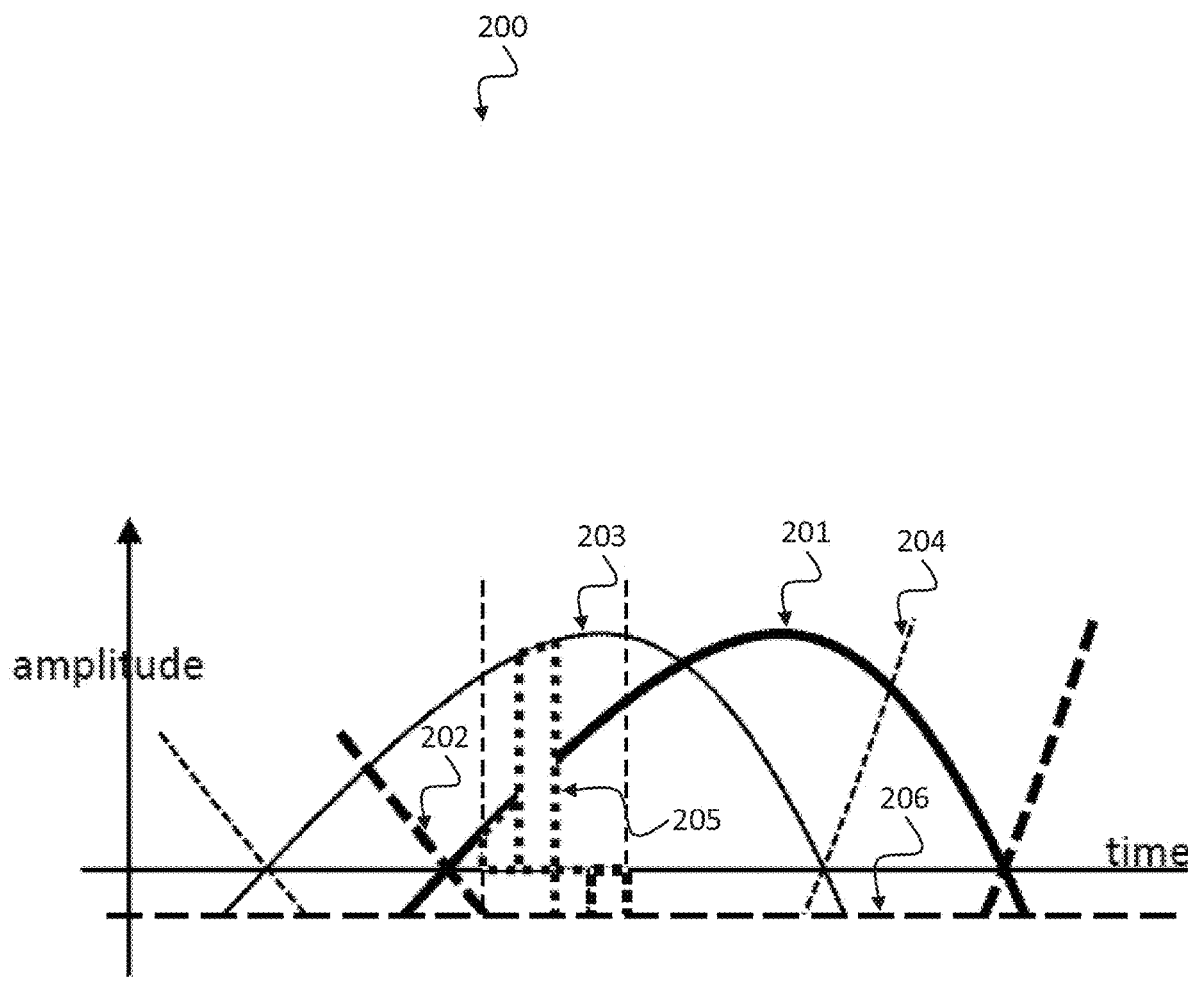
FIG. 2 shows a graph illustrating exemplary analog up-conversion waveforms over time at a single-ended output.
Figure 3:
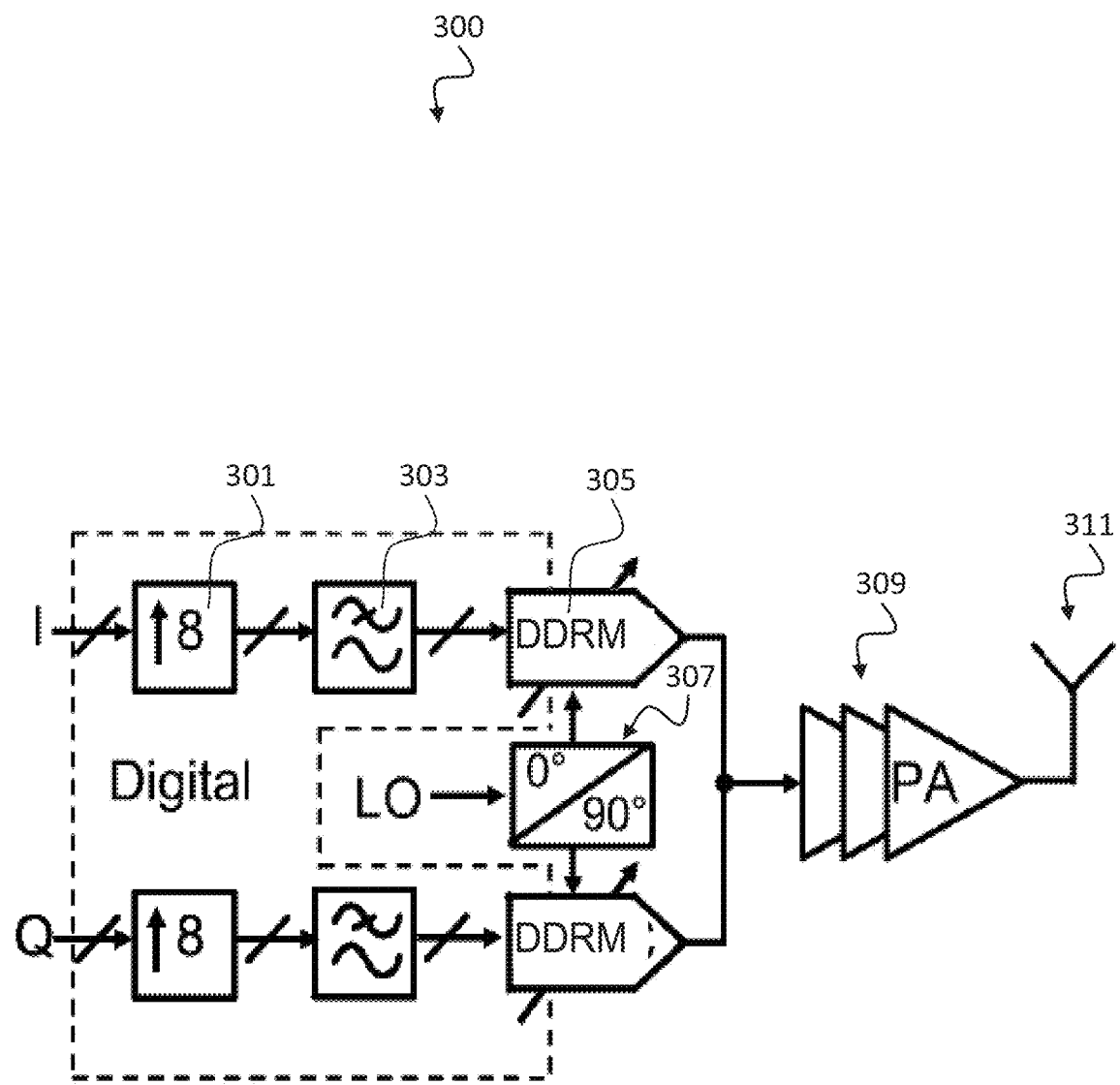
FIG. 3 shows a block diagram illustrating a DDRM based transmitter.
Figure 4:
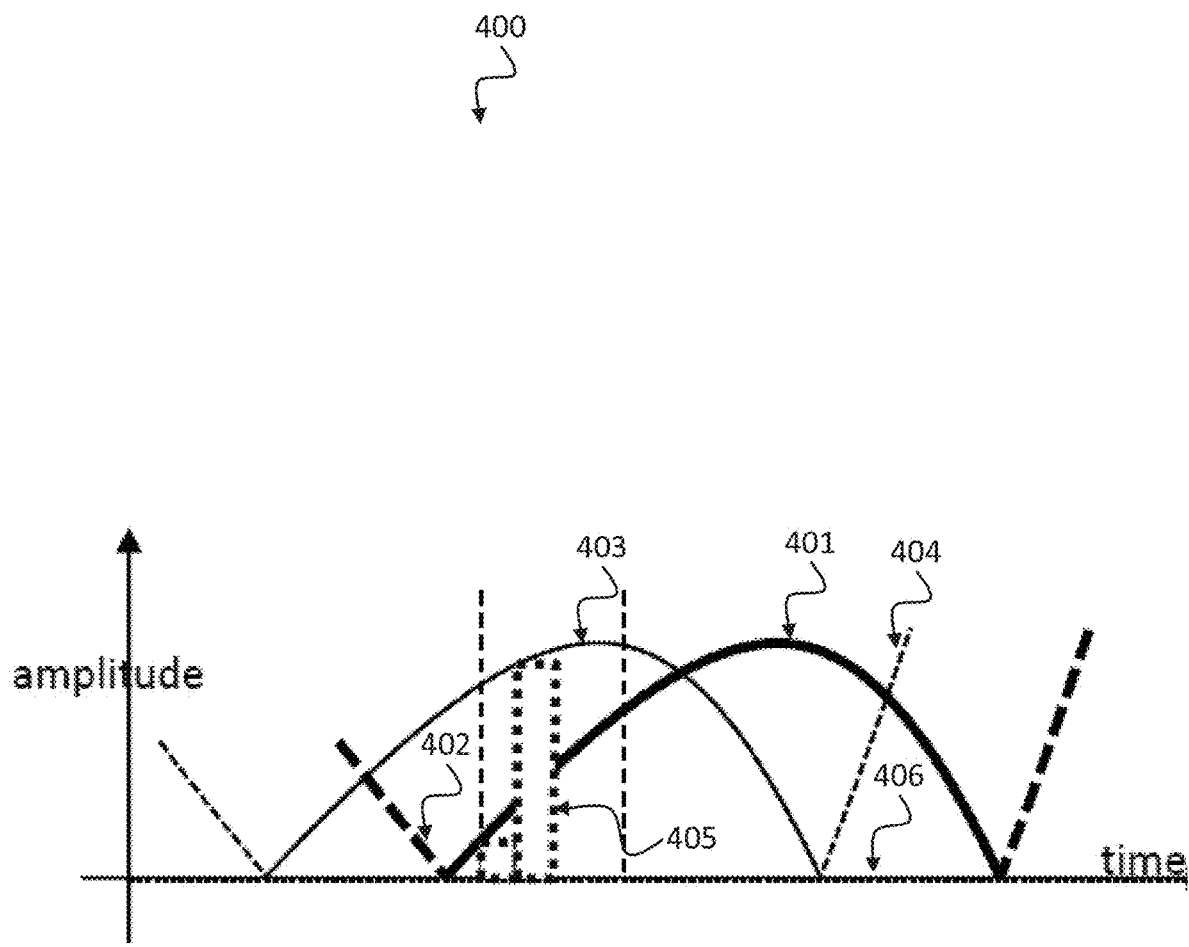
FIG. 4 shows a graph illustrating exemplary output waveforms of a digital transmitter at a single-ended output.
Figure 5:
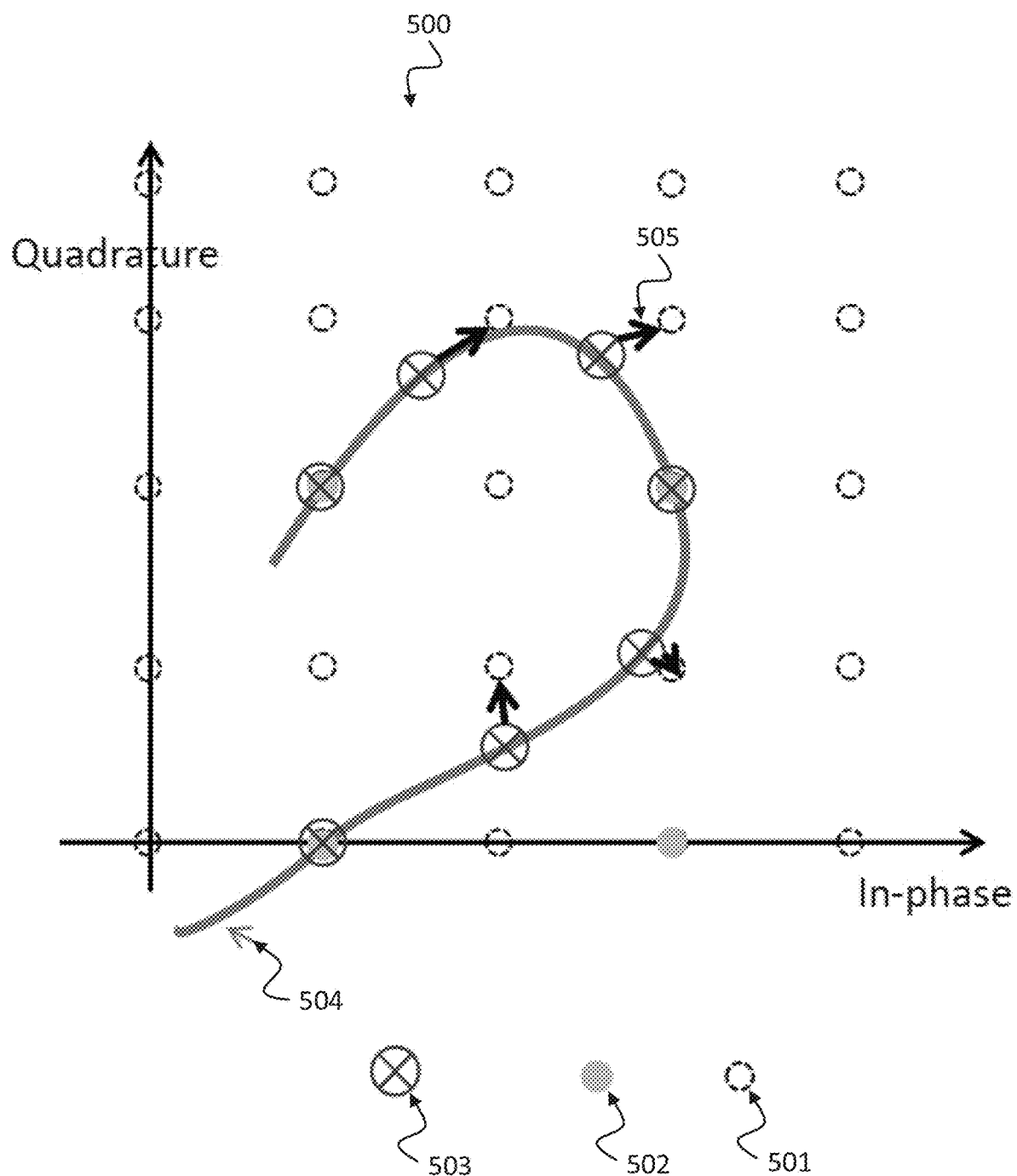
FIG. 5 shows a baseband equivalent constellation diagram illustrating an exemplary trajectory.
Figure 6:
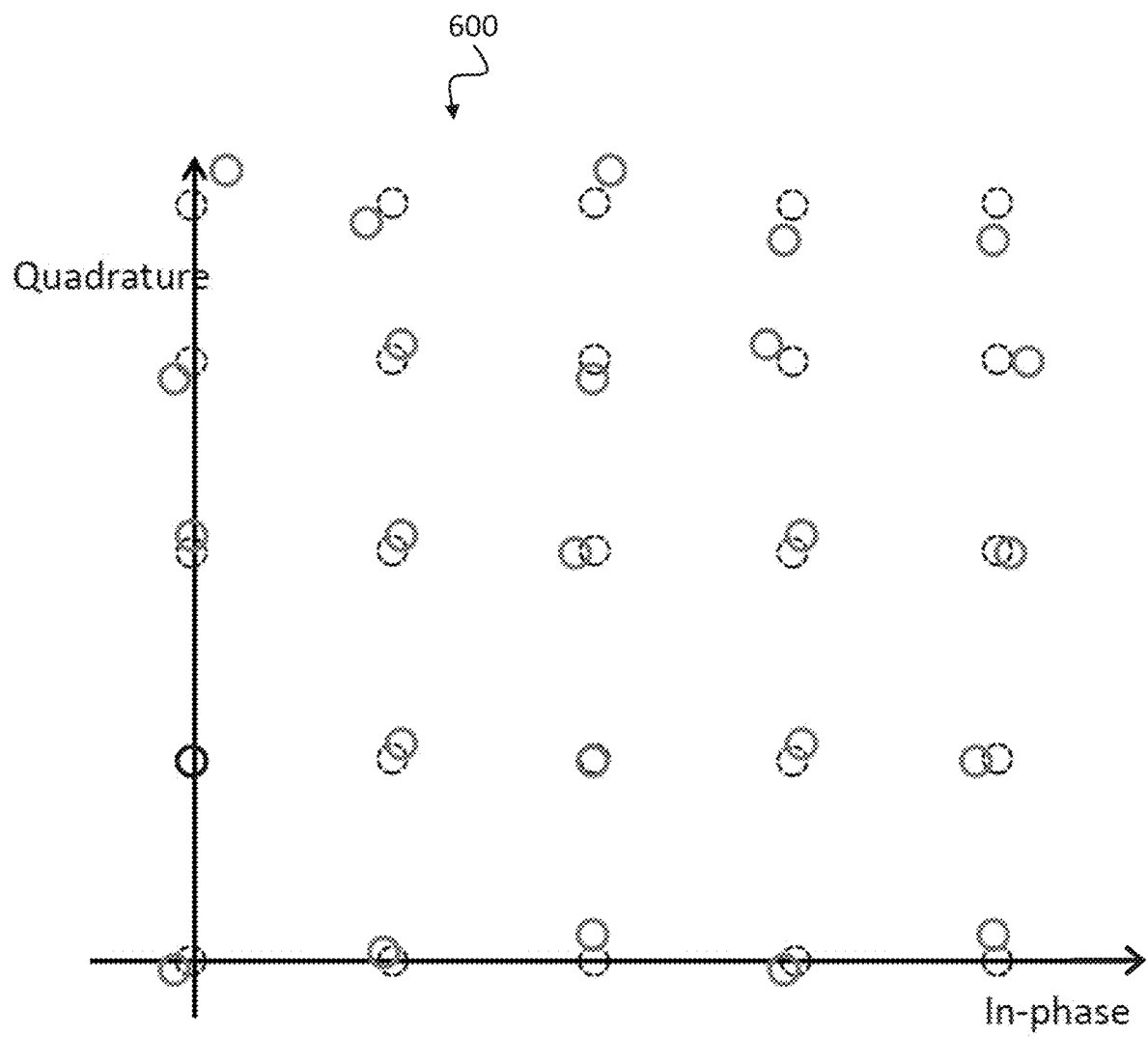
FIG. 6 shows a constellation diagram illustrating exemplary mismatch errors.
Figure 7:
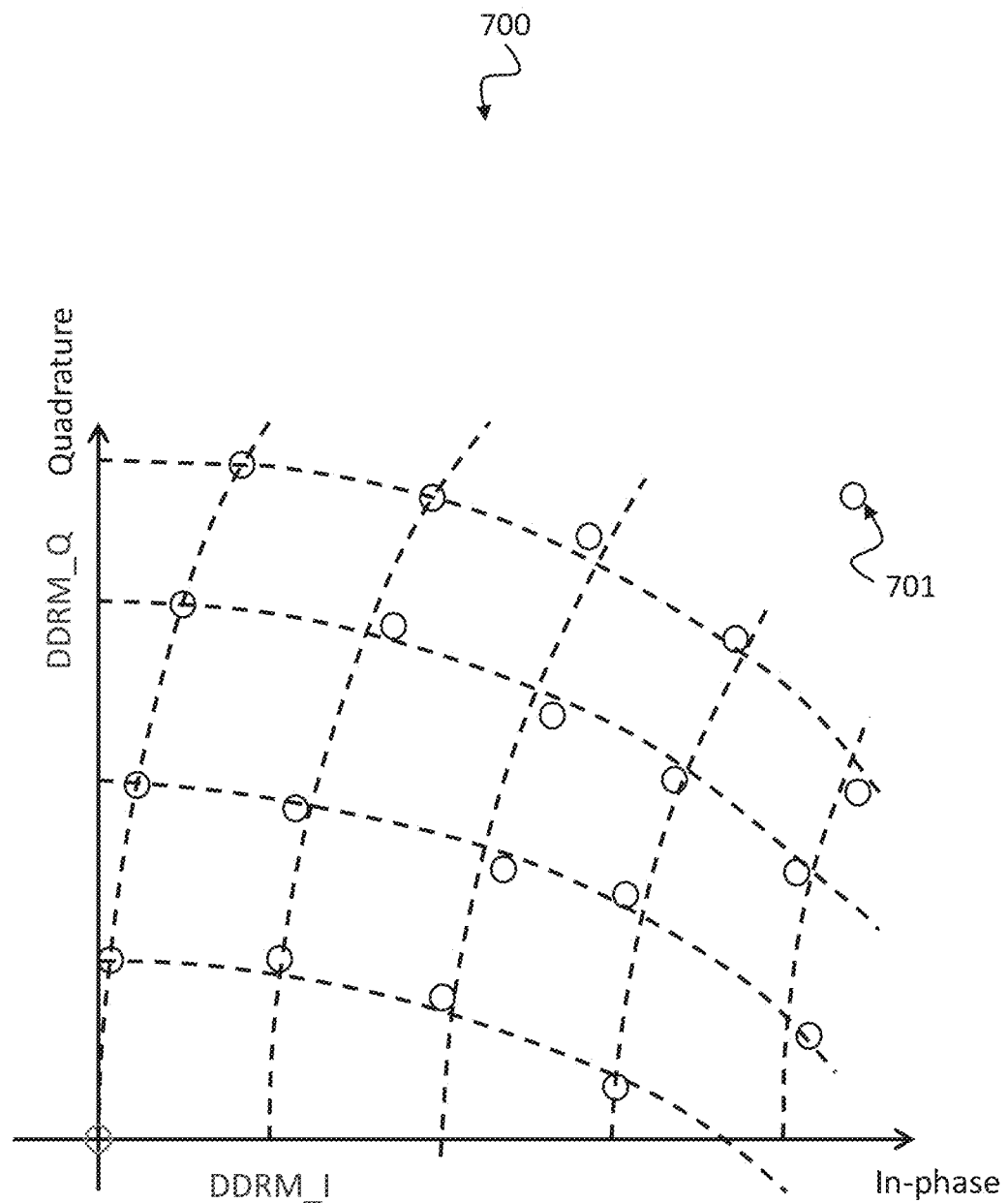
FIG. 7 shows a constellation diagram illustrating a constellation distorted by compression and mismatch.

The representation of the digital baseband signal 802 can be a representation of a higher accuracy, e.g. in an in-phase quadrature plane as illustrated in FIGS. 5 to 7 with a higher resolution of the digital samples compared to the original resolution of the digital baseband signal 802. Alternatively, the representation can be an analog representation of the digital baseband signal 802. The error compensator can subtract the error signal 806 from the RF signal 804 or alternatively add an inverse of the error signal 806 to the RF signal 804 or use another equivalent operation.

The error estimator 803 may determine the error signal 806 based on a quantization error between the digital baseband signal 802 and the RF signal 804. The error estimator 803 may determine the quantization error based on Least Significant Bits in the digital baseband signal 802 that are not used by the DDRM 801.

The error estimator 803 may determine the error signal 806 based on a mismatch error resulting from a systematic deviation of the DDRM 801 from its nominal output signal characteristic. The mismatch error may correspond to a known deviation of a signal constellation used by the DDRM 801 from its nominal signal pattern, in particular a nominal signal pattern that is provided from a calibration procedure.

In one implementation the DDRM 801 may generate an analog RF signal and the error estimator 803 may determine the error signal 806 resulting from a deviation based on the generated analog RF signal and an analog representation of the digital baseband signal 802.

The error-compensated direct digital modulation device 800 may further include a DAC 1011 to provide the error signal 806 as an analog error signal, e.g. a DAC 1153 as described below with respect to FIG. 10. Alternatively, the error-compensated direct digital modulation device 800 may include a second DDRM, e.g. similar to the DDRM 801 or having the same design as the DDRM 801 to provide the error signal 806 as an analog error signal.

The error-compensated direct digital modulation device 800 may further include a noise shaper, e.g. a noise shaper 1009 as described below with respect to FIG. 10 to noise shape the error signal 806 before providing it to the DAC or alternatively to the second DDRM as described above.

The DAC or the second DDRM may operate on a different sample rate, e.g. a sample rate that is higher than a local oscillator (LO) frequency of the DDRM 801. For example a sample rate that is equal to four times the LO frequency.

The DAC or in the alternative implementation the second DDRM may provide the error signal by using a first clock signal. The DDRM 801 may modulate the digital baseband signal 802 by using a second clock signal that may be derived from the first clock signal, e.g. by using by a clock divider, for example a clock divider 1109 as described below with respect to FIG. 11.

The error-compensated direct digital modulation device 800 may include a quadrature clock generator, e.g. a clock generator 1105 as described below with respect to FIG. 11 to generate a first differential input clock signal LOp_I, LOn_I, 1113 and a second differential input clock signal LOp_Q, LOn_Q, 1114 based on the second clock signal F2LO_p, F2LO_n, 1112. The first differential input clock signal LOp_I, LOn_I, 1113 and the second differential input clock signal LOp_Q, LOn_Q, 1114 may have orthogonal phases.

The DDRM 801 may include a first sign swapper, e.g. a sign swapper 1103 as described below with respect to FIG. 11 to swap a phase of the first differential input clock signal LOp_I, LOn_I, 1113 based on a first control signal SIGN_I, 1121. The DDRM 801 may include a second sign swapper, e.g. a sign swapper 1104 as described below with respect to FIG. 11 to swap a phase of the second differential input clock signal LOp_Q, LOn_Q, 1114 based on a second control signal SIGN_Q, 1122.

The DDRM 801 may include a first direct digital RF amplitude modulator, e.g. a device 1101 as described below with respect to FIG. 11 to generate a first differential current Ip_I, In_I, 1131 based on a first magnitude control signal MAG_I, 1133 derived from the digital baseband signal 802 and based on the first differential input clock signal LOp_I, LOn_I, 1113.

The DDRM 801 may include a second direct digital RF amplitude modulator, e.g. a device 1102 as described below with respect to FIG. 11 to generate a second differential current Ip_Q, In_Q, 1132 based on a second magnitude control signal MAG_Q, 1134 derived from the digital baseband signal 802 and based on the second differential input clock signal LOp_Q, LOn_Q, 1114.

The DDRM 801 may include a controller, e.g. a controller 1107 as described below with respect to FIG. 11 to provide the first magnitude control signal MAG_I, 1133 and the second magnitude control signal MAG_Q, 1134 based on the digital baseband signal 802.

The error-compensated direct digital modulation device 800 may include a signal combiner, e.g. a signal combiner 1141 as described below with respect to FIG. 11 to combine the first differential current Ip_I, In_I, 1131, the second differential current Ip_Q, In_Q, 1132 and an inverse differential current generated by the DAC or alternatively by the second DDRM to provide the error compensated RF signal 808.

In the following, further improvement mechanisms are described that can be applied additionally to the disclosed error compensation path described above for further improving the accuracy of the DDRM device.

The resolution of the DDRM 801 can be improved by subdividing the smallest unit element into smaller elements. This will lower the errors due to quantization.

The effective accuracy however may be improved only if the subdivided unit elements can be manufactured sufficiently accurate such that their manufacturing uncertainty is not larger than the quantization step they represent. This leads to an element matching requirement that is not easy to satisfy.

The simplest way to meet the matching requirement is to increase the area of each unit element. Unfortunately each additional bit of resolution hence my result in a 4-times increase of area of the entire matched array: an additional bit may require twice the amount of unit cells, and to meet the accuracy specification each element may need to be twice as big. For the specifications targeted this yields an unrealistic design in terms of area (cost). Furthermore the higher area yields larger parasitics that will for example result in higher power consumption, reduced output tuning range and more distortion due to timing differences.

Another method to improve unit element matching in conventional digital-to-analog converters is to employ calibration. In this case each unit element is measured against a reference unit and is then tuned to make it equal within a certain error margin. To be able to perform this operation two elements are required: the infrastructure to measure the difference between an element and a reference with a given accuracy; and the possibility to tune the unit elements contribution to the output. Especially the second point proves to be difficult in DDRMs because the circuits used don't always allow for easy tuning of each cells amplitude and/or phase.

A third method is to employ dynamic element matching techniques that allow randomizing and/or shaping the effect of element errors ("mismatch shaping"). The downside of such techniques is that they are very complicated in their digital control resulting in large area and power consumption. Furthermore they increase the activity in the entire system resulting in even more power consumption.

The time-invariant harmonic distortion in transmitters is solved by digital predistortion, either by calculating/approximating the inverse of the distortion function and then applying that to the input signal, or by using some lookup table based method. DDRM's are no exception to this and can relatively easily support this type of digital pre-distortion. To keep the implementation complexity under control the inverse transfer function used for such DPD must be implemented in an exact manner without introducing additional errors.

In certain DDRM implementations, there are some distortion mechanisms that are not time-invariant but are nevertheless relatively easy to predict based upon the input data. It can even happen that these errors are not directly function of the input signal but originate from the structure chosen for the implementation of the DDRM. Examples of these are gradients in amplitude or phase caused by layout of amongst others bias lines, decoupling circuits, output lines or clock lines. Such errors cannot easily be compensated by means of an approximate inverse function or by lookup-tables, and if so such methods may require excessive complexity.

The mechanisms described above may be implemented together with the error compensation path to further improve the accuracy of the DDRM device.

Figure 9:
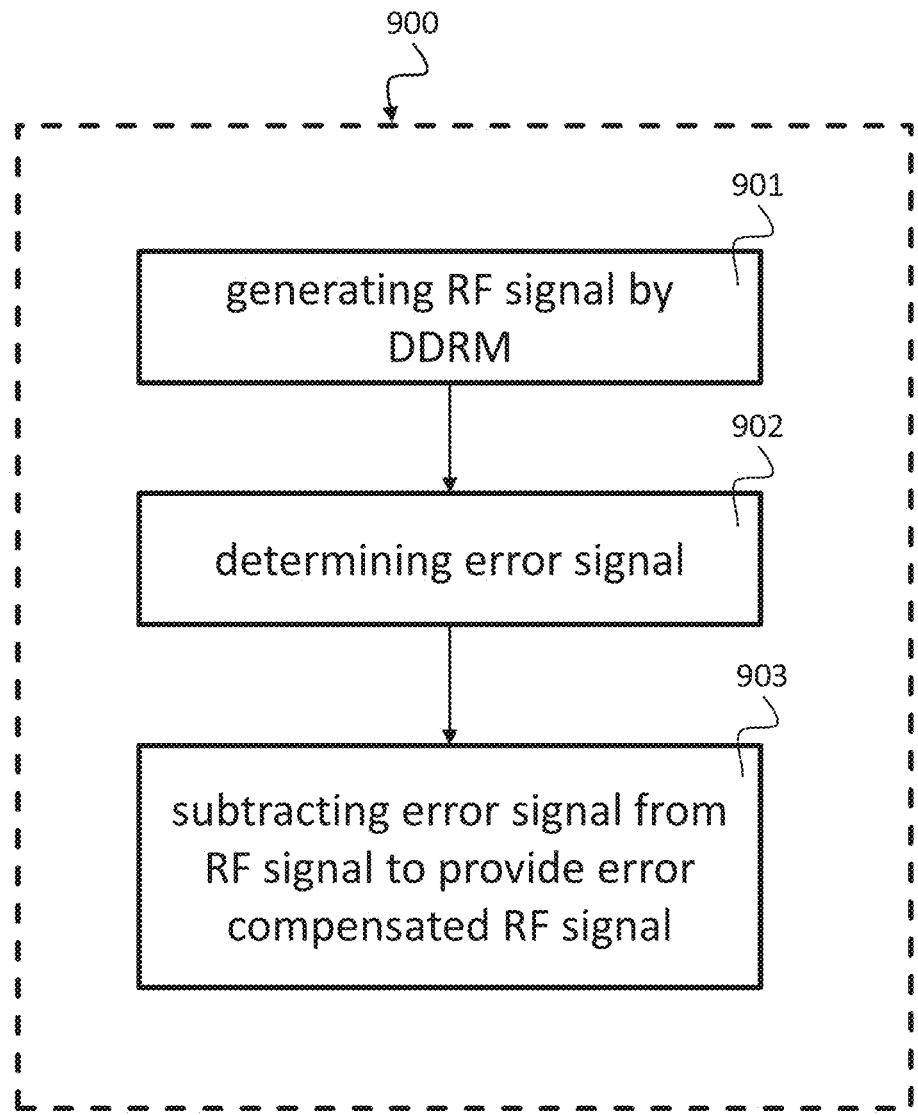
FIG. 9 shows a schematic diagram illustrating a method 900 for providing an error-compensated RF signal based on a digital baseband signal according to an implementation form.

FIG. 9 shows a schematic diagram illustrating a method 900 for providing an error-compensated RF signal based on a digital baseband signal according to an implementation form.

The method 900 includes generating 901 a radio frequency (RF) signal based on a modulation of a digital baseband signal by using a direct digital radio frequency modulator (DDRM), e.g. as described above with respect to FIG. 8.

The method 900 includes determining 902 an error signal resulting from a deviation based on the generated RF signal and a representation of the digital baseband signal, e.g. as described above with respect to FIG. 8.

The method 900 further includes subtracting 903 the error signal from the RF signal to provide an error compensated RF signal, e.g. as described above with respect to FIG. 8.

The method 900 can be generally applied for improving the accuracy of data-converted signals, for example analog signals generated by Digital-to-Analog converters or output signals of other data converters. The method 900 is not limited to an RF signal that is output from a DDRM.

Figure 10:
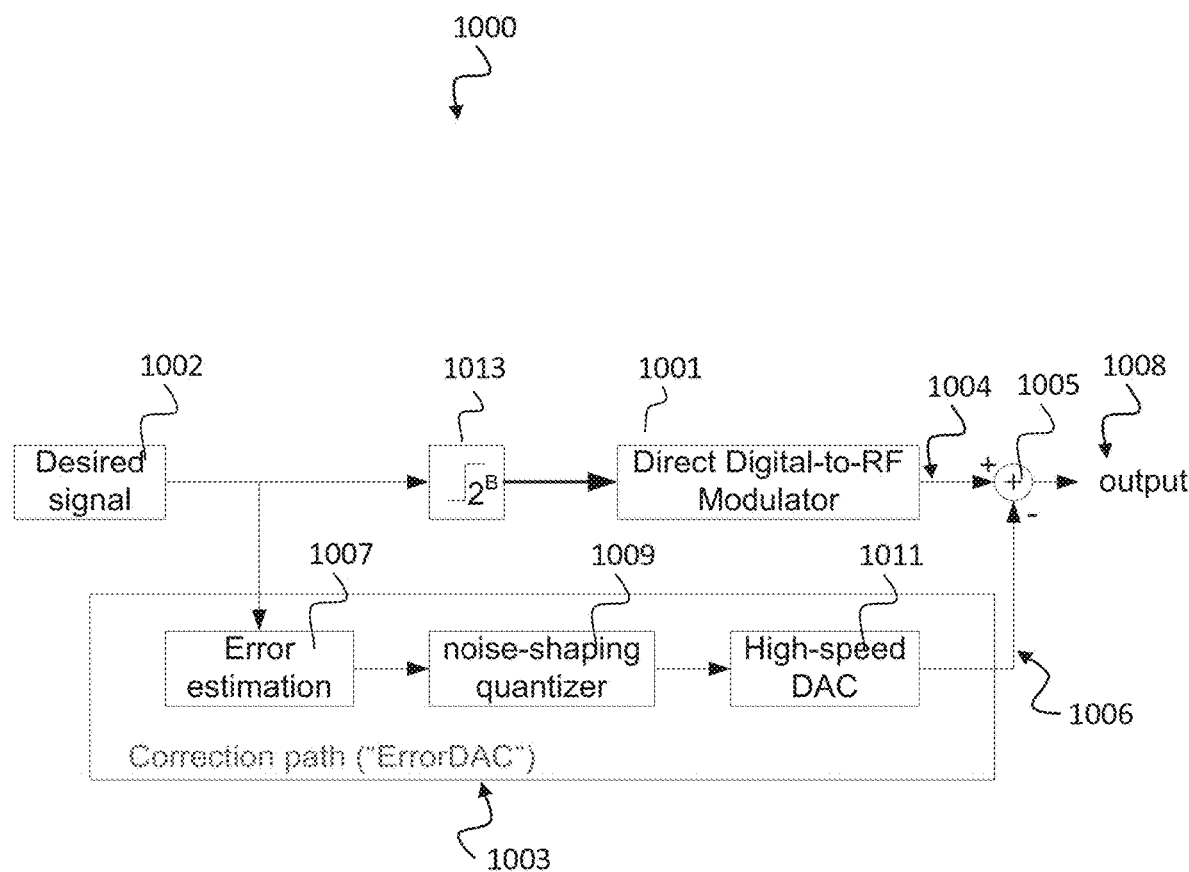
FIG. 10 shows a block diagram illustrating an error-compensated direct digital modulation transmitter according to an implementation form.

FIG. 10 shows a block diagram illustrating an error-compensated direct digital modulation transmitter 1000 according to an implementation form. The error-compensated direct digital modulation transmitter 1000 is an exemplary implementation of a DDRM device 800 as described above with respect to FIG. 8.

The illustrated architecture 1000 adds a DAC 1011 in parallel with the DDRM 1001 that serves as a feed-forward compensation path ("ErrorDAC") 1003. The feed-forward compensation path is also called error compensation path or error DAC path or just This ErrorDAC 1003 may include an error estimator 1007 or error estimation device, an optional noise shaping quantizer 1009 and a Digital-to-Analog Converter DAC 1011, in particular a high-speed DAC. Alternatively, the DAC 1011 may be replaced by a second DDRM or by any other data converter. The output of this ErrorDAC 1003 is subtracted 1005 from the DDRM output signal 1004. The input signal of the ErrorDAC 1003 is an approximation of the aggregate error that is expected to be generated by the DDRM 1001. As a consequence the sum of DDRM 1001 and ErrorDAC 1003 will contain less error than when using the DDRM 1001 alone, yielding a higher accuracy.

The input signal to the ErrorDAC 1003 is calculated to be an approximation of the combined effect of the significant error contributors noted above. The digital nature of a DDRM makes that most error signals are strongly correlated with the input signal or with internal control signals derived from the input signal. Hence these errors are highly predictable.

The quantization error is readily available as it is simply the difference between the desired signal 1002 and the quantized signal. In other words the quantization error is equal to the LSB's in the input signal that are not used by the DDRM 1001.

The deviation of each unit element value from its nominal value is determined using a calibration procedure executed during factory calibration, at transceiver startup or in the background while the system is running. At run-time it is then determined what specific unit elements are turned at any given time and what their combined deviation from the aggregate nominal value is. Similar calibration routines are used to determine the properties of the other distortion mechanisms.

The requirements for spectral purity in the target application are not uniform over frequency but are only very stringent in specific subsets of the spectrum (e.g. RX band). This means that the feed-forward signal can be spectrally noise shaped in order to improve its accuracy in such sensitive spectral zones. This enables simpler ErrorDAC designs, and in addition the shaping can be done on the ErrorDAC 1003 only without requiring shaping on the main DDRM 1001. As the ErrorDAC 1003 can operate at a sample rate that is higher than the DDRM LO it is possible to achieve even higher accuracy just by increasing the sample rate of the ErrorDAC 1003.

By using such architecture as illustrated and described in FIG. 10, the following advantages can be achieved. First advantage is the accuracy improvement of a DDRM without having to increase the area of the matched element. This means lower cost compared to an intrinsically matched DDRM, lower power consumption compared to an intrinsically matched DDRM as the dynamic clock and data signals do not have to be routed over large area and increased tuning range at the output of the entire transmitter compared to an intrinsically matched DDRM due to the lower parasitic output capacitance associated with lower area. These advantages can be achieved without the requirement to be able to tune the elements in the DDRM. In one embodiment the different errors may be estimated from the received signal hence it does not require dedicated measurement infrastructure to measure these. The output spectrum can be noise-shaped without having to noise-shape the entire input signal, this being a costly operation in terms of power and area. Furthermore the effect of all error sources is subject to noise shaping, while in baseband noise-shaping only the quantization noise is shaped. The update rate of the ErrorDAC can be chosen independently from the DDRM data or LO rate. It is possible to use an update rate for the ErrorDAC that is higher than the LO frequency of the DDRM, meaning that the noise shaping can have more effect.

By using this architecture 1000, the major problem with the DDRM approach can be solved, i.e. introduction of errors due to splitting up the transmitter in several discrete slices can be compensated. If the slices can be fabricated perfectly equal to their desired weight and no layout imperfections are present, the biggest error is the quantization error. But in practical implementations there is manufacturing variation and layout compromises have to be made resulting in the effective weight of a slice differing from its designed-for weight. The generation of errors between slices that are called hereinafter as "mismatch errors" can be compensated by applying the disclosed architecture 1000. The disclosed compensation can compensate such mismatch errors that can have both an amplitude and timing (phase) aspect, in the sense that the effective pulse generated by a slice can contain more or less energy than desired, can come earlier or later than expected and can have a pulse shape deviating from the desired one. The disclosed architecture can remove effects of all of these errors such as unwanted signal content present in the recombined signal spectrum.

The ErrorDAC based DDRM will first measure the mismatch error on each manufactured device for a set of states at some point in time, for example at factory calibration or at chip startup. During normal operation the composite error vector will be calculated from that set of measurements for each successive DDRM state being used. The inverse of this error vector will then be added to the output using a high-speed DAC to ensure that the constellation point generated by the entire system is (on average) identical to the desired point. In addition the input signal to the error DAC will be shaped in such a way that the residual error after summing the DDRM and ErrorDAC is minimal in a specific frequency region. Usually this region will be the receive band as to not desensitize the receiver in full-duplex operation.

A Direct-Digital RF Modulator is used both for modulation and pre-PA power generation, hence needs to be reasonably efficient. This efficiency requirement conflicts with the accuracy requirement on several fronts, the most important ones being static linearity due to matching. This limits the effective number of bits, and improving it requires an increase of area which comes with an increase of capacitance therefore increased power consumption and dynamic non-linearity.

To circumvent this trade-off the disclosed transmitter 1000 allows generation of some errors by the DDRM, but correct them with a highly accurate but potentially inefficient DAC. This is a digital implementation of a feed-forward error-correction concept. The digital nature of the system allows overcoming the most important implementation difficulties of feed-forward error correction being gain (amplitude) and phase (timing) matching. Furthermore quite a lot of the errors in a digital transmitter have a very predictable nature as they change only when the sample clock triggers and are associated with specific slices being enabled or not.

The desired signal baseband signal 1002 may be used to control a DDRM circuit 1001 and a correction path 1003. The ErrorDAC 1003 may include an error estimation algorithm 1007 based upon a model of the main DDRM, (optionally) a noise shaping quantizer 1009 to reduce the bitwidth and a high-speed DAC 1011 to convert the digital signal into an analog signal that can be summed 1005 with the main path 1001.

The output of the ErrorDAC path 1003 is an approximation of the errors introduced by the main DDRM path 1001 while converting the desired signal 1002 into an RF modulated signal 1004. When this ErrorDAC output signal 1006 subtracted from the main DDRM signal 1004 the DDRM induced errors in the combined output signal 1008 will be attenuated.

It should be noted that from it appears to be possible to formulate this as implementing the DDRM LSB's differently and using a form of pre-distortion to control them. However this would be a too restrictive interpretation of the concept for the following reasons: The correction path doesn't have to be a DDRM but can be a DAC operating at a sample rate different from the DDRM sample rate. This can be a frequency related to the DAC sample rate or LO but the does not have to be the case. In the preferred embodiment the ErrorDAC 1003 is operated at four times the LO frequency. This means that every LO/4 phase a different correction can be applied, enabling very wide-bandwidth correction. Furthermore it means that very high oversampling is available, reducing the issues with out-of-band noise and reducing the requirements on the number of bits in the DAC.

The total current (output power) of the compensation path is independent of the current in the main DDRM. For example it can be larger than one main DDRM LSB, allowing correction for any missing codes that may be present in the Main DDRM. Error estimation is significantly easier for a DAC compared to a DDRM. There can be overlap in the amplitude range of the DAC and DDRM, in other words, the ErrDAC total current can be larger than one LSB of the main DDRM.

Note that the maximum output current of the compensation path may be just a fraction of the main DDRM output current. E.g. for a 10-bit DDRM with a compensation path that overlaps with 2 DDRM LSB's the output current may be just $1/512$ of the main DDRM output current. This represents a very small portion of the total power consumed by the combined system and hence the efficiency of the compensation path becomes irrelevant. This enables design techniques that yield a highly linear compensation path but that are not viable for the power generation path due to their impact on system efficiency, e.g. Class-A/always-on, Return-to-Zero, etc.

The ErrorDAC itself puts out a second quantization error with respect to the quantization error it is supposed to cancel. This residual error remains in the output signal of the transmitter. But by properly designing the noise shaper used in the ErrorDAC input signal generation it can be moved to frequencies where it doesn't matter. The fact that the noise shaper operates only on the residual error signal having a reduced wordlength compared to the full signal makes that the shaper can be implemented with less resources, e.g. area, power, etc.

Additionally, the correction signal that is generated by the compensation path can have significantly different characteristics than the signal generated by the DDRM, depending on what errors are compensated. If the compensation path is only used to improve quantization noise and to fix static mismatch the signal it processes is very noise-like and contains no actual signal. This significantly reduces the nonlinearity requirements of the ErrorDAC.

Figure 11:
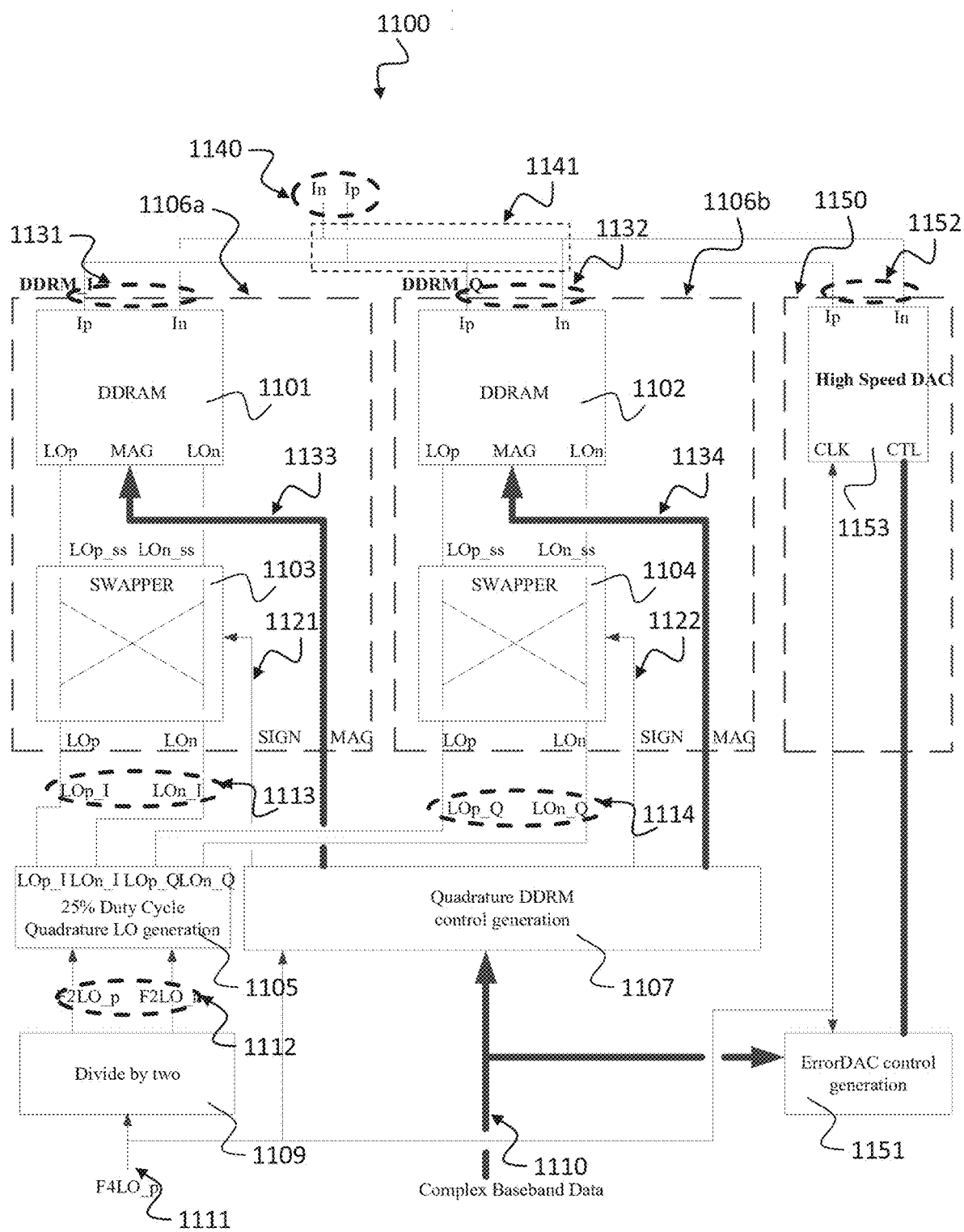
FIG. 11 shows a block diagram illustrating a quadrature DDRM with Error DAC compensation path according to an implementation form.

FIG. 11 shows a block diagram illustrating a quadrature DDRM 1100 with Error DAC compensation path according to an implementation form. The quadrature DDRM 1100 with Error DAC compensation path is an exemplary implementation of a DDRM device 800 as described above with respect to FIG. 8.

The error-compensated quadrature DDRM 1100 includes a direct digital radio frequency modulator DDRM 1106a, 1106b that generates a radio frequency (RF) signal 1131, 1132 based on a modulation of a digital baseband signal 1110. The direct digital radio frequency modulator DDRM 1106a, 1106b may include an in-phase DDRM 1106a and a quadrature DDRM 1106b. The error-compensated quadrature DDRM 1100 includes an error estimator 1150 that determines an error signal 1152 resulting from a deviation based on the generated RF signal 1131, 1132 and a representation of the digital baseband signal 1110. The error-compensated quadrature DDRM 1100 includes an error compensator 1141 that subtracts the error signal 1152 from the RF signal 1131, 1132 to provide an error compensated RF signal 1140.

The error estimator 1150 may determine the error signal 1152 based on a quantization error between the digital baseband signal 1110 and the RF signal 1131, 1132. The error estimator 1150 may determine the quantization error based on Least Significant Bits in the digital baseband signal 1110 that are not used by the DDRM 1106a, 1106b. The error estimator 1150 may determine the error signal 1152 based on a mismatch error resulting from a systematic deviation of the DDRM 1106a, 1106b from its nominal output signal characteristic. The mismatch error may correspond to a known deviation of a signal constellation used by the DDRM 1106a, 1106b from its nominal signal pattern, in particular a nominal signal pattern that is provided from a calibration procedure.

The DDRM 1106a, 1106b may generate an analog RF signal; and the error estimator 1150 may determine the error signal 1152 resulting from a deviation based on the generated analog RF signal 1131, 1132 and an analog representation of the digital baseband signal 1110. The quadrature DDRM 1100 with Error DAC compensation path may further include a digital-to-analog converter (DAC) 1153 or alternatively a second DDRM to provide the error signal 1152 as an analog error signal.

The quadrature DDRM 1100 with Error DAC compensation path may include a noise shaper, e.g. a noise shaper 1009 as described above with respect to FIG. 10 to noise shape the error signal 1152 before providing it to the DAC 1153 or alternatively to the second DDRM.

The DAC 1153 or the alternative second DDRM may operate on a sample rate that is higher than a local oscillator (LO) frequency 1113 of the DDRM 1106a, 1106b, in particular a sample rate that is equal to four times the LO frequency 1113.

The DAC 1153 or the alternative second DDRM may provide the error signal 1152 by using a first clock signal F4LO, 1111. The DDRM 1106a, 1106b may modulate the digital baseband signal 1110 by using a second clock signal F2LO_p, F2LO_n, 1112 that may be derived from the first clock signal F4LO, 1111, in particular by a clock divider 1109.

The quadrature DDRM 1100 with Error DAC compensation path may include a quadrature clock generator 1105 to generate a first differential input clock signal LOp_I, LOn_I, 1113 and a second differential input clock signal LOp_Q, LOn_Q, 1114 based on the second clock signal F2LO_p, F2LO_n, 1112. The first differential input clock signal LOp_I, LOn_I, 1113 and the second differential input clock signal LOp_Q, LOn_Q, 1114 may have orthogonal phases.

The in-phase DDRM 1106a may include a first sign swapper 1103 to swap a phase of the first differential input clock signal LOp_I, LOn_I, 1113 based on a first control signal SIGN_I, 1121. The quadrature DDRM 1106b may include a second sign swapper 1104 to swap a phase of the second differential input clock signal LOp_Q, LOn_Q, 1114 based on a second control signal SIGN_Q, 1122.

The DDRM 1106a, 1106b may include a first direct digital RF amplitude modulator 1101, a second direct digital RF amplitude modulator 1102 and a controller 1107. The first direct digital RF amplitude modulator 1101 may generate a first differential current Ip_I, In_I, 1131 based on a first magnitude control signal MAG_I, 1133 derived from the digital baseband signal 1110 and based on the first differential input clock signal LOp_I, LOn_I, 1113. The second direct digital RF amplitude modulator 1102 may generate a second differential current Ip_Q, In_Q, 1132 based on a second magnitude control signal MAG_Q, 1134 derived from the digital baseband signal 1110 and based on the second differential input clock signal LOp_Q, LOn_Q, 1114. The controller 1107 may provide the first magnitude control signal MAG_I, 1133 and the second magnitude control signal MAG_Q, 1134 based on the digital baseband signal 1110.

The quadrature DDRM 1100 with Error DAC compensation path may include a signal combiner 1141, e.g. a signal adder, to combine the first differential current Ip_I, In_I, 1131, the second differential current Ip_Q, In_Q, 1132 and an inverse differential current generated by the DAC 1153 or the alternative second DDRM to provide the error compensated RF signal 1140.

The output of the in-phase and quadrature DDRMs 1106a, 1106b and the High-speed DAC 1153 may be connected together to sum their currents. This operation may be implemented by the signal combiner 1141.

Both the DDRM quadrature clock and the High-speed DAC clock may be generated from a master clock, e.g. a master clock running at 4*FLO (F4LO).

The DDRM control data may be generated based upon the complex baseband data 1110 according to the segmentation choices made for the DDRAMs 1106a, 1106b in the DDRMs used, e.g. by using a quadrature DDRM control generation device 1107, i.e. the above described controller 1107.

The control data for the High-speed DAC 1153 may also be generated from the complex baseband data 1110, e.g. by using an Error DAC control generation device 1151 that may also be implemented in the above described controller 1107 or that may be implemented as a separate controlling device.

The first building block of a DDRM based transmitter is the Direct-Digital-RF-Amplitude-Modulator ("DDRAM"). This circuit generates a modulated RF carrier with digitally controlled amplitude as described next.

Figure 12:
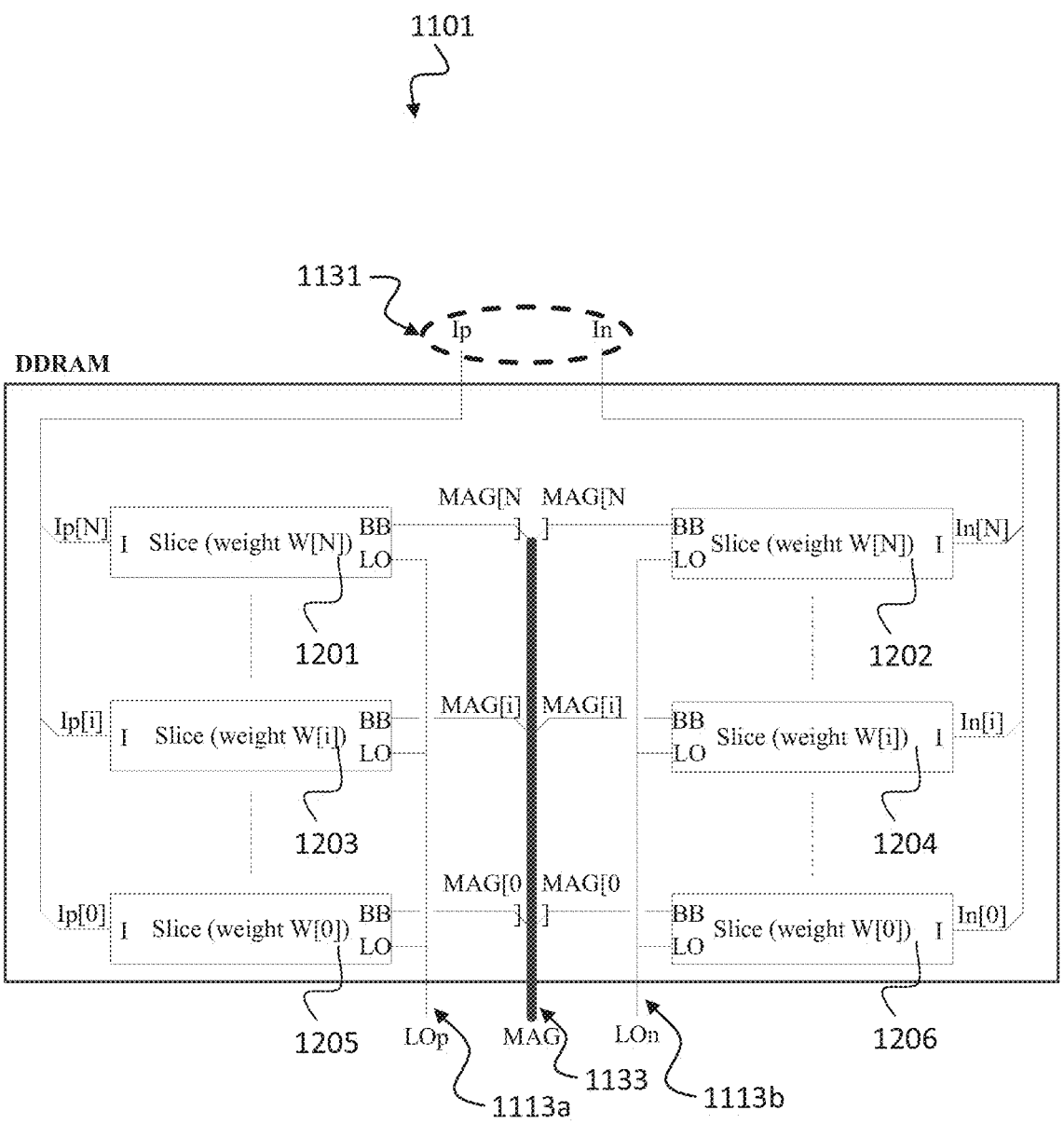
FIG. 12 shows a block diagram illustrating a Direct-Digital Amplitude Modulator that may be used in the error-compensated quadrature DDRM of FIG. 11 according to an implementation form.

FIG. 12 shows a block diagram illustrating a Direct-Digital Amplitude Modulator 1200 that may be used in the error-compensated quadrature DDRM 1100 of FIG. 11 according to an implementation form.

The Direct-Digital Amplitude Modulator 1200 includes a plurality of slices 1201, 1202, 1203, 1204, 1205, 1206 to generate the differential output signal 1131.

The DDRAM 1101, 1102 is a block that may generate a differential current Ip, In, 1131 based upon a differential input clock ("LO") 1113a, 1113b and a magnitude control signal 1133.

The magnitude of the differential output current is proportional to the weighted sum of the MAG control signals 1133 according to the following equation:

$$\mathrm{mag}(Ip-In) \sim \Sigma_{i=0}^{N} \mathrm{MAG}[i] \cdot W[i]$$

The control signals MAG[i] should be calculated such that the magnitude of the output signal has the appropriate value.

An example DDRAM with 10-bit resolution is composed of 5 binary weighted slices and 31 unary weighted slices as illustrated by following table 1:

TABLE 1

| parameters of an example DDRAM with 10-bit resolution | |
|---|---|
| Slice index (i) | Weight W[i] |
| 0 | 1 |
| 1 | 2 |
| 2 | 4 |
| 3 | 8 |
| 4 | 16 |
| 5 to 31 | 32 |

Figure 13:
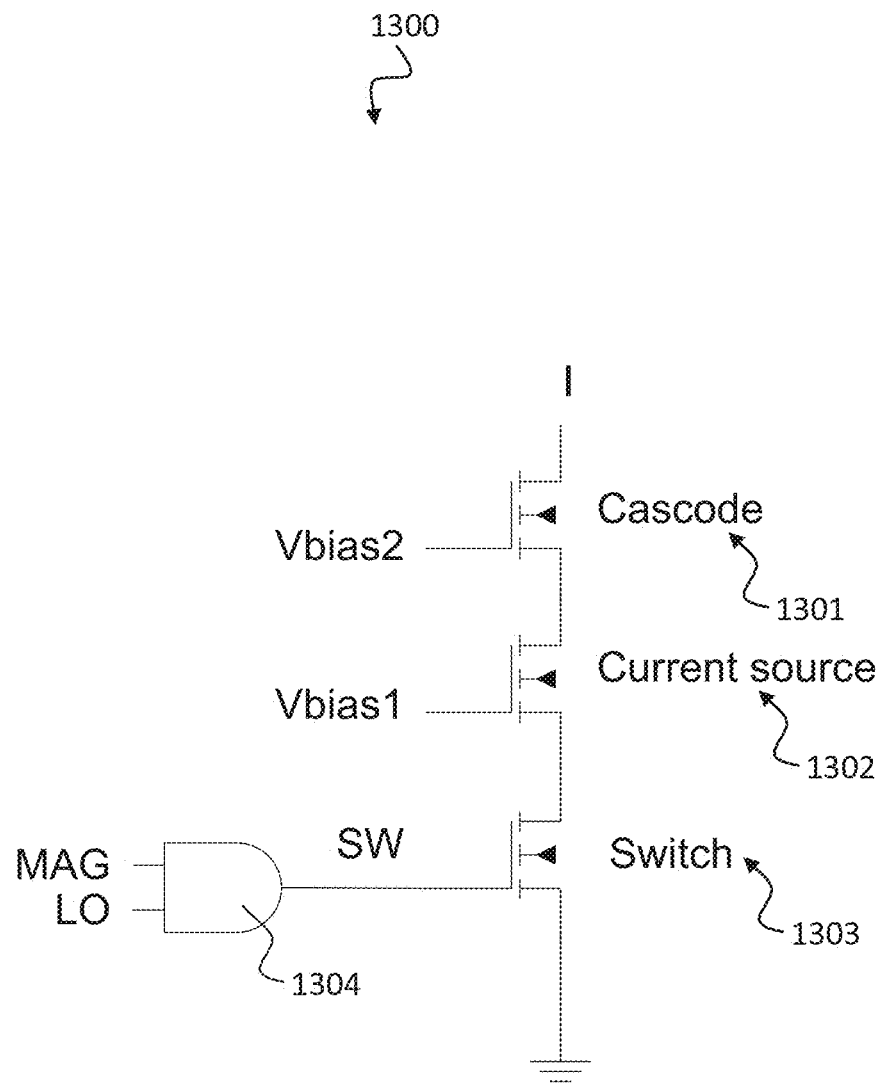
FIG. 13 shows a block diagram illustrating an exemplary implementation of a slice of the Direct-Digital Amplitude Modulator of FIG. 12 according to an implementation form.

FIG. 13 shows a block diagram illustrating an exemplary implementation of a slice of the Direct-Digital Amplitude Modulator 1200 of FIG. 12 according to an implementation form.

The incoming LO signal is gated with the MAG signal in a gate element 1304 to create a switch control signal "SW" that is a MAG controlled LO signal. The SW signal controls a switch transistor 1303 that on its turn enables a current source 1302. The current source 1302 is biased (Vbias1) and/or sized to implement the weight desired for the slice. To shield the current source transistor 1302 from the output and to increase the output impedance a cascode transistor 1301 can be added.

It should be noted that the LOp and LOn signals do not have to be fully differential in the sense that their sum does not have to be constant. The only constraint is that they should have 180 degrees of an RF cycle phase difference (=TLO/2). They can have duty cycles that differ from 50%.

Figure 14:
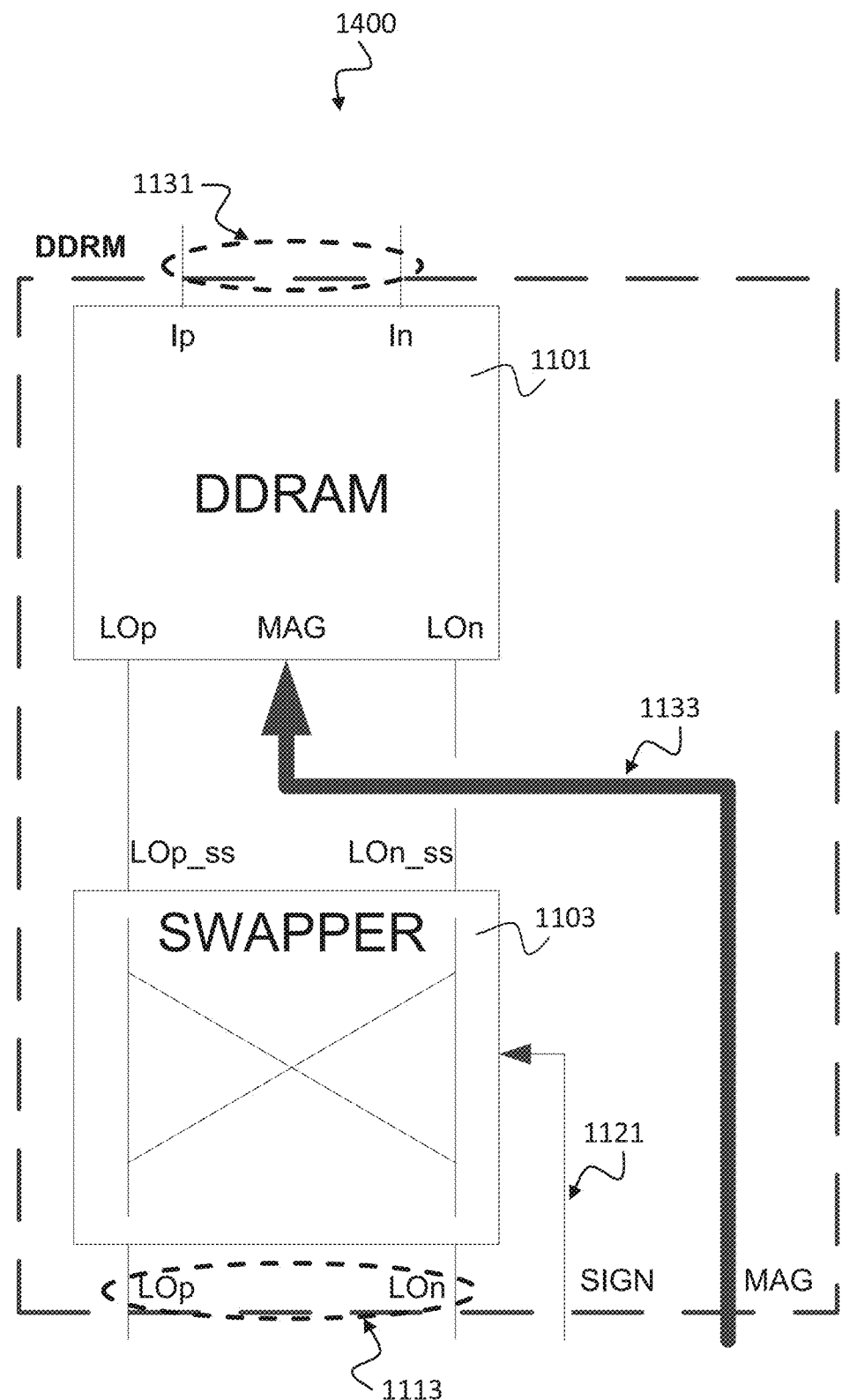
FIG. 14 shows a block diagram illustrating a single-phase DDRM that may be used in the error-compensated quadrature DDRM of FIG. 11 according to an implementation form.

FIG. 14 shows a block diagram illustrating a single-phase DDRM 1400 that may be used in the error-compensated quadrature DDRM 1100 of FIG. 11 according to an implementation form.

To augment the DDRAM described above with negative baseband value support a sign-swapper 1103 may be added to the DDRAM 1101 as shown in FIG. 14. This results in a fully capable single-phase DDRM 1400.

The implementation of negative baseband values can be performed by swapping the phase of the corresponding LO signal. For modulating −x(t) on to carrier We the following relations hold:

$$OUT(t)=-x(t)*\cos(Wc*t)$$

$$OUT(t)=x(t)*-\cos(Wc*t)$$

$$\ldots[-\cos(x)=\cos(pi-x)]\ldots$$

$$OUT(t)=x(t)*\cos(pi-Wc*t)$$

$$\ldots[\cos(x)=\cos(-x)]\ldots$$

$$OUT(t)=x(t)*\cos(Wc*t-pi)$$

Hence, generating −x(t) is the same as generating x(t) with 180 deg phase LO shift.

Figure 15:
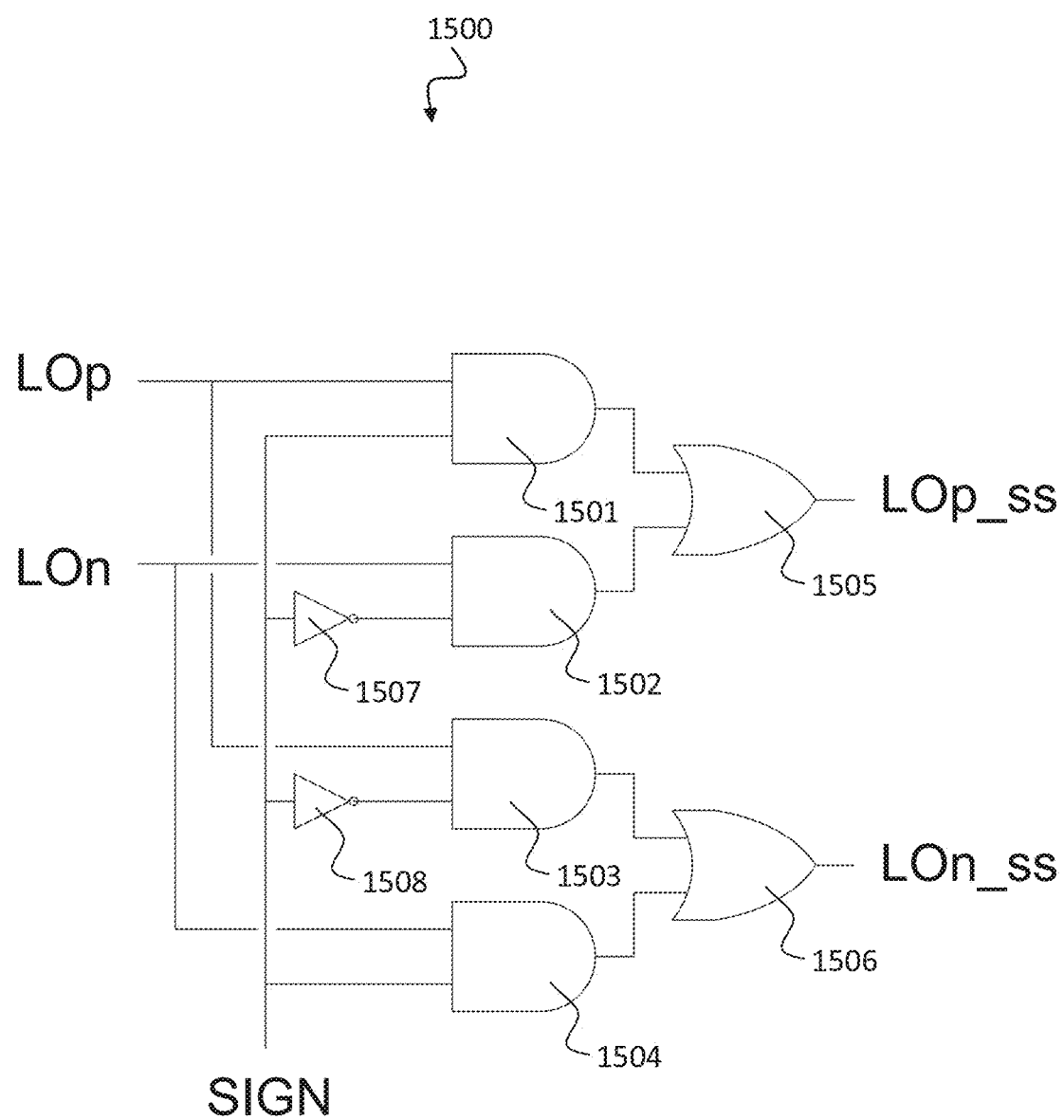
FIG. 15 shows a block diagram illustrating an exemplary sign swapper that may be used in the error-compensated quadrature DDRM of FIG. 11 according to an implementation form.

FIG. 15 shows a block diagram illustrating an exemplary sign swapper 1500 that may be used in the error-compensated quadrature DDRM 1100 of FIG. 11 according to an implementation form.

LOp signal is provided as first input of a first AND gate 1501 and as first input of a third AND gate 1503. LOn signal is provided as first input of a second AND gate 1502 and as first input of a fourth AND gate 1504. SIGN signal is provided as second input of the first AND gate 1501 and as second input of the fourth AND gate 1504. Inverted SIGN signal is provided as second input of the second AND gate 1502 and as second input of the third AND gate 1503. Respective inverters 1507, 1508 are used to invert the SIGN signal. The output of first AND gate 1501 is provided as first input of a first OR gate 1505. The output of second AND gate 1502 is provided as second input of the first OR gate 1505. The output of third AND gate 1503 is provided as first input of a second OR gate 1506. The output of fourth AND gate 1504 is provided as second input of the second OR gate 1506. The output of first OR gate 1505 provides signal LOp_ss. The output of second OR gate 1506 provides signal LOn_ss.

Again it should be noted that the LOp and LOn signals do not have to be fully differential in the sense that their sum does not have to be constant. The only constraint is that they should have 180 degrees of an RF cycle phase difference (=TLO/2). They can have duty cycles that differ from 50%. The same applies to the LOp_ss and LOn_ss signals.

Figure 16:
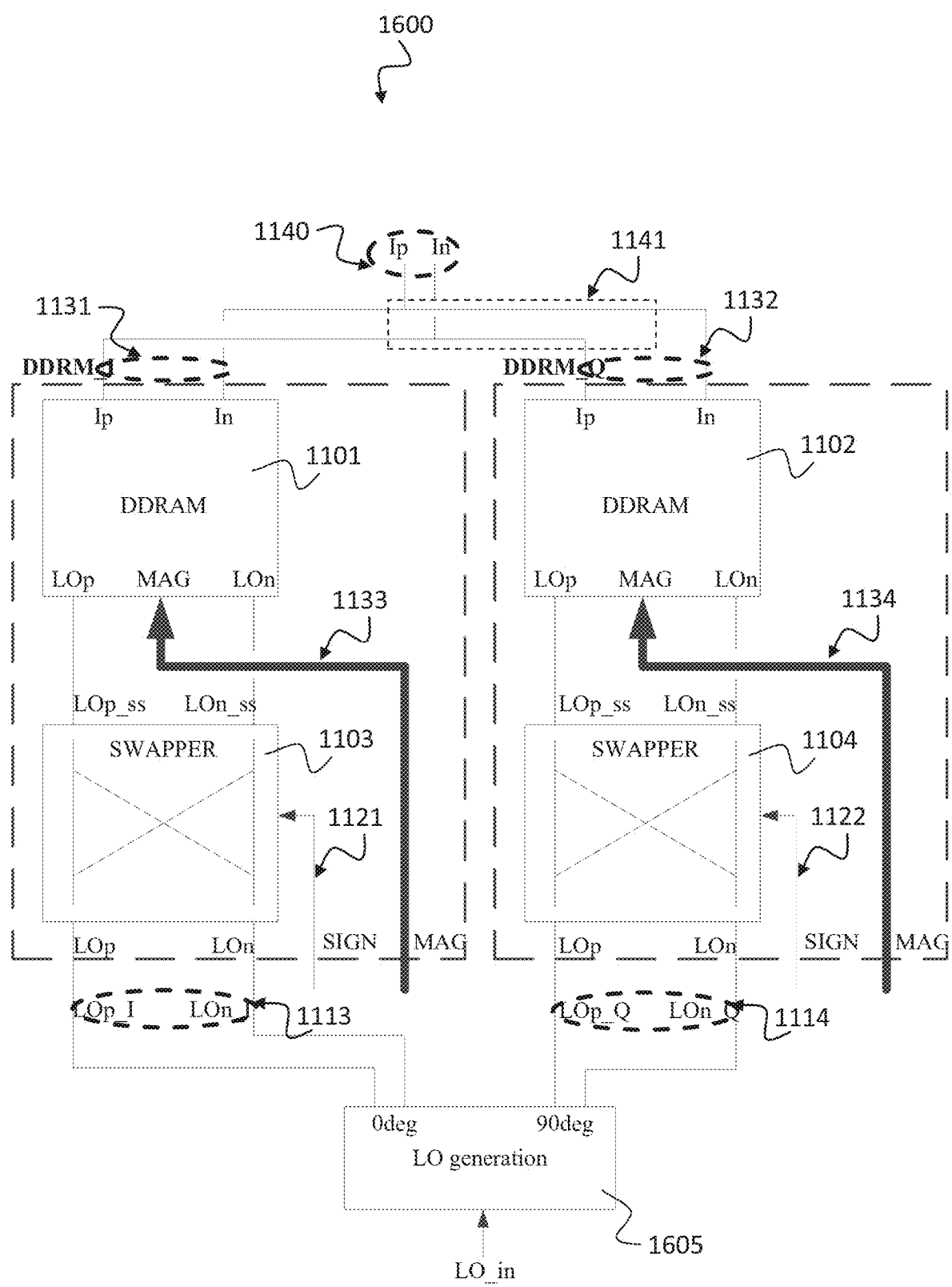
FIG. 16 shows a block diagram illustrating an exemplary quadrature DDRM that may be used in the error-compensated quadrature DDRM of FIG. 11 according to an implementation form.

FIG. 16 shows a block diagram illustrating an exemplary quadrature DDRM 1600 that may be used in the error-compensated quadrature DDRM 1100 of FIG. 11 according to an implementation form.

The single-phase DDRM described above is not sufficient to support complex modulation. In order to support this multiple DDRMs can be combined into a multi-phase DDRM. Such multi-phase DDRMs support complex modulation if their LO phases are orthogonal to each other.

The most simple implementation of such a multiphase DDRM employs two LO signals that are 90 degrees out of phase. This results in a Quadrature DDRM 1600 as shown in FIG. 16.

Again it should be noted that the LOp_I and LOn_I signals do not have to be fully differential but only require that they are 180 degrees out of phase. The same applies to the LOp_Q and LOn_Q signals.

Figure 17:
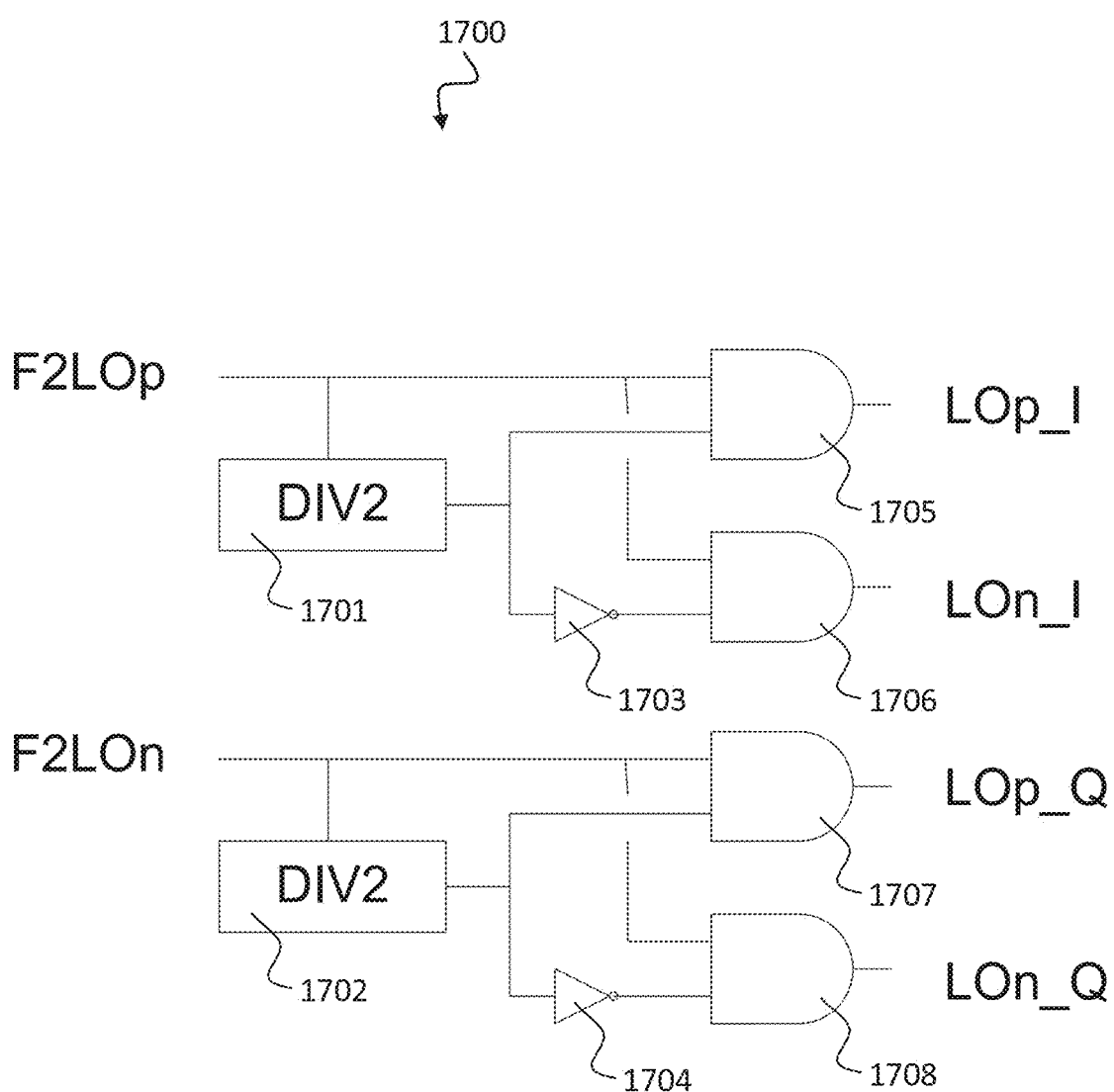
FIG. 17 shows a block diagram illustrating an exemplary quadrature 25% LO generator that may be used in the quadrature DDRM of FIG. 16 according to an implementation form.

FIG. 17 shows a block diagram illustrating an exemplary quadrature 25% LO generator 1700 that may be used in the quadrature DDRM 1600 of FIG. 16 according to an implementation form.

An attractive configuration is to use 25% duty cycle quadrature LO signals. In this case all 4 LO signals LOp_I, LOn_I, LOp_Q and LOn_Q have a duty cycle of 25% of the LO period. Their phase shift is 0 deg, 180 deg, 90 deg and 270 deg respectively.

Such set of LO signals can be generated from a differential clock with frequency 2*FLO by the circuit shown in FIG. 17.

In this circuit F2LOp signal is provided as first input of a first AND gate 1705 and as first input of a second AND gate 1706. F2LOp signal divided by 2 (using a divider DIV2 1701) is provided as second input of the first AND gate 1705. The inverted signal (F2LOp divided by 2 passing an inverter 1703) is provided as second input of the second AND gate 1706.

F2LOn signal is provided as first input of a third AND gate 1707 and as first input of a fourth AND gate 1708. F2LOn signal divided by 2 (using a divider DIV2 1702) is provided as second input of the third AND gate 1707. The inverted signal (F2LOn divided by 2 passing an inverter 1704 is provided as second input of the fourth AND gate 1708.

The output of first AND gate 1705 provides signal LOp_I. The output of second AND gate 1706 provides signal LOn_I. The output of third AND gate 1707 provides signal LOp_Q. The output of fourth AND gate 1708 provides signal LOn_Q.

Figure 18:
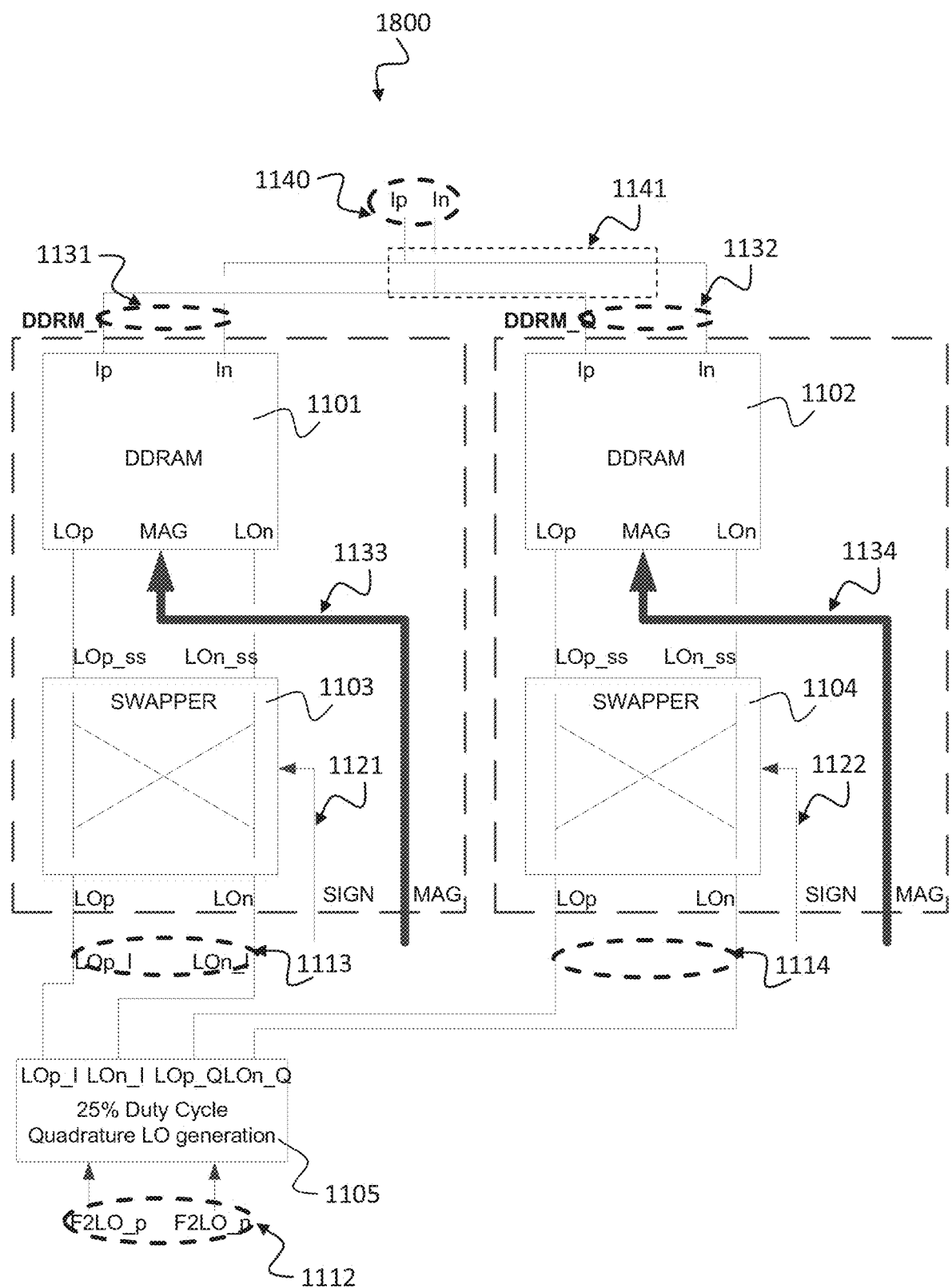
FIG. 18 shows a block diagram illustrating an exemplary 25% duty cycle quadrature LO based DDRM that may be used in the error-compensated quadrature DDRM of FIG. 11 according to an implementation form.

FIG. 18 shows a block diagram illustrating an exemplary 25% duty cycle quadrature LO based DDRM 1800 that may be used in the error-compensated quadrature DDRM 1100 of FIG. 11 according to an implementation form.

A DDRM based upon such clocking scheme as described above with respect to FIG. 17 is shown in FIG. 18. It should be noted that a possible circuit optimization is to merge the 25% duty cycle LO generation with the LO sign swapper in each of the DDRMs.

Figure 19:
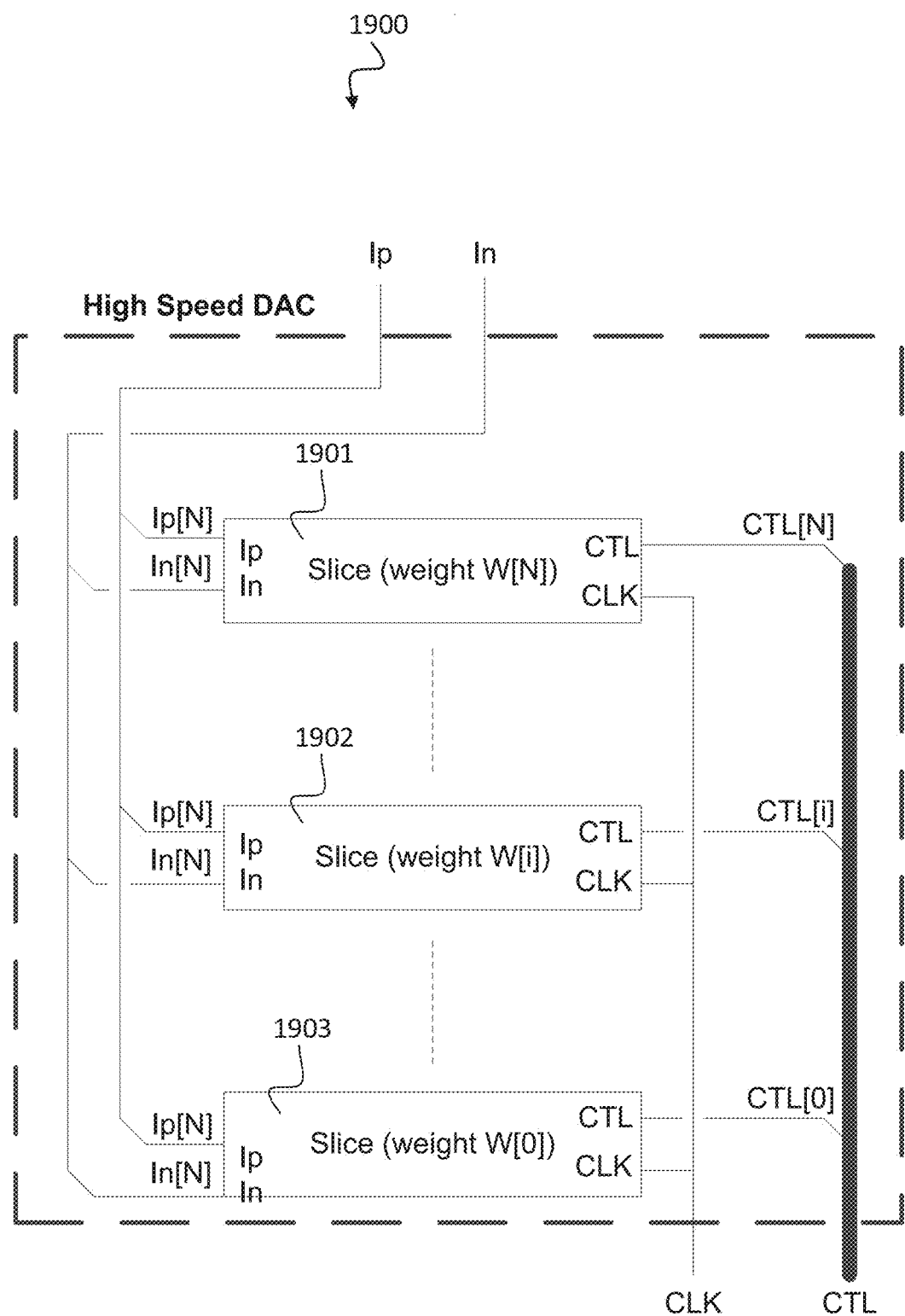
FIG. 19 shows a block diagram illustrating an exemplary high-speed DAC that may be used in the error compensation path of the error-compensated quadrature DDRM of FIG. 11 or of the DDRM of FIG. 8 according to an implementation form.

FIG. 19 shows a block diagram illustrating an exemplary high-speed DAC 1900 that may be used in the error compensation path of the error-compensated quadrature DDRM 1100 of FIG. 11 or of the DDRM of FIG. 8 according to an implementation form.

An example implementation of the DAC for the Error-DAC compensation path is shown in FIG. 19. It is based upon a weighted set of slices 1901, 1902, 1903 where an example slice is shown in FIG. 20.

The DAC 1900 includes a plurality of slices 1901, 1902, 1903 to generate the differential output signal Ip, In based upon an input clock signal CLK and a control signal CTL.

Figure 20:
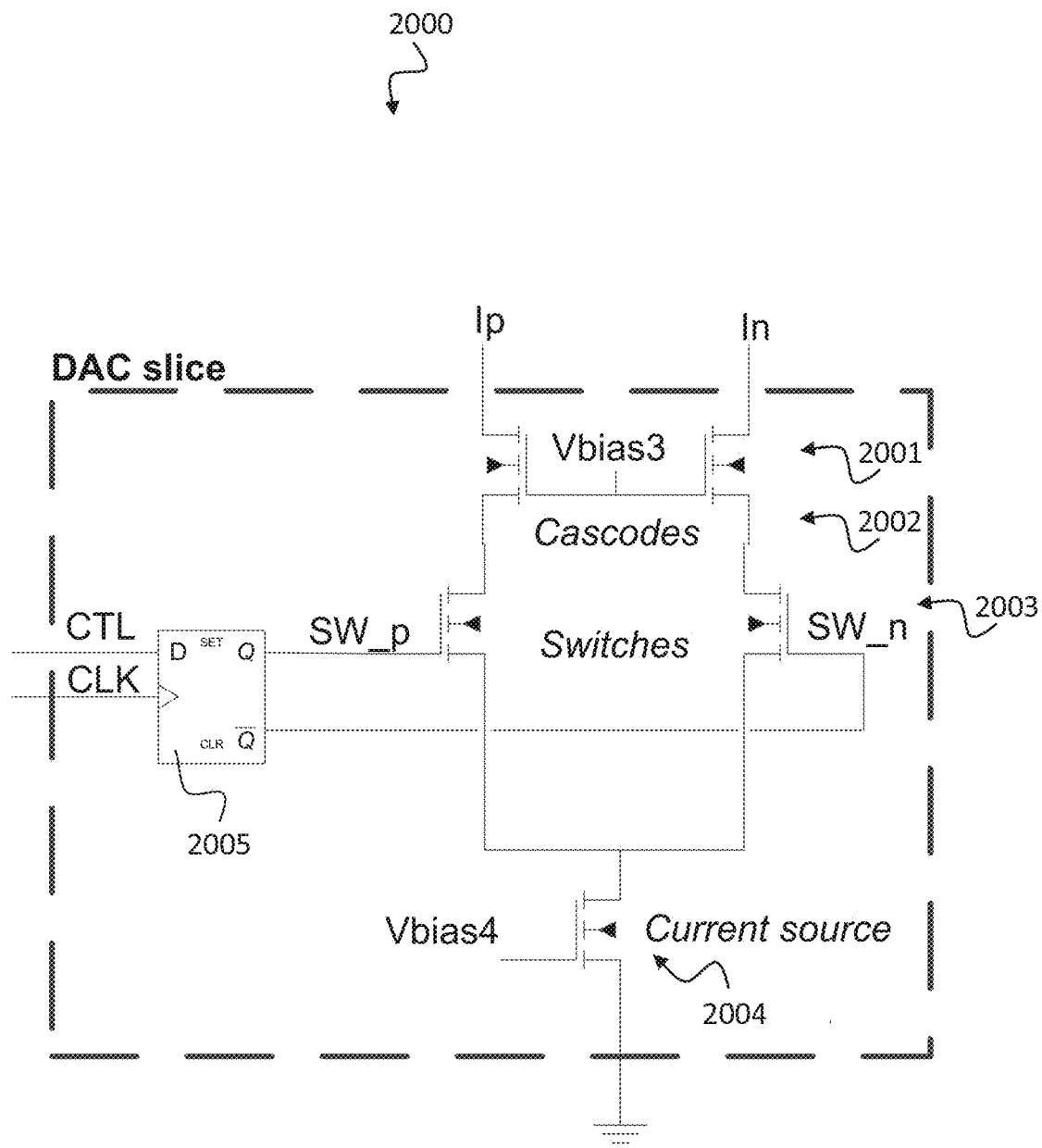
FIG. 20 shows a block diagram illustrating an exemplary slice of the high-speed DAC of FIG. 19 according to an implementation form.

FIG. 20 shows a block diagram illustrating an exemplary slice 2000 of the high-speed DAC 1900 of FIG. 19 according to an implementation form.

The incoming CTL signal is gated with the CLK signal in a gate element 2005 such as a D-Flipflop to create a positive switch control signal "SW_p" and a negative switch control signal "SW_n". The SW_p and SW_n signals control a pair of switch transistors 2003 that on its turn enable a current source 2004. The current source 2004 is biased (Vbias4) and/or sized to implement the weight desired for the slice. To shield the current source transistor 2004 from the output and to increase the output impedance a pair of cascode transistors 2001 can be added.

Figure 21:
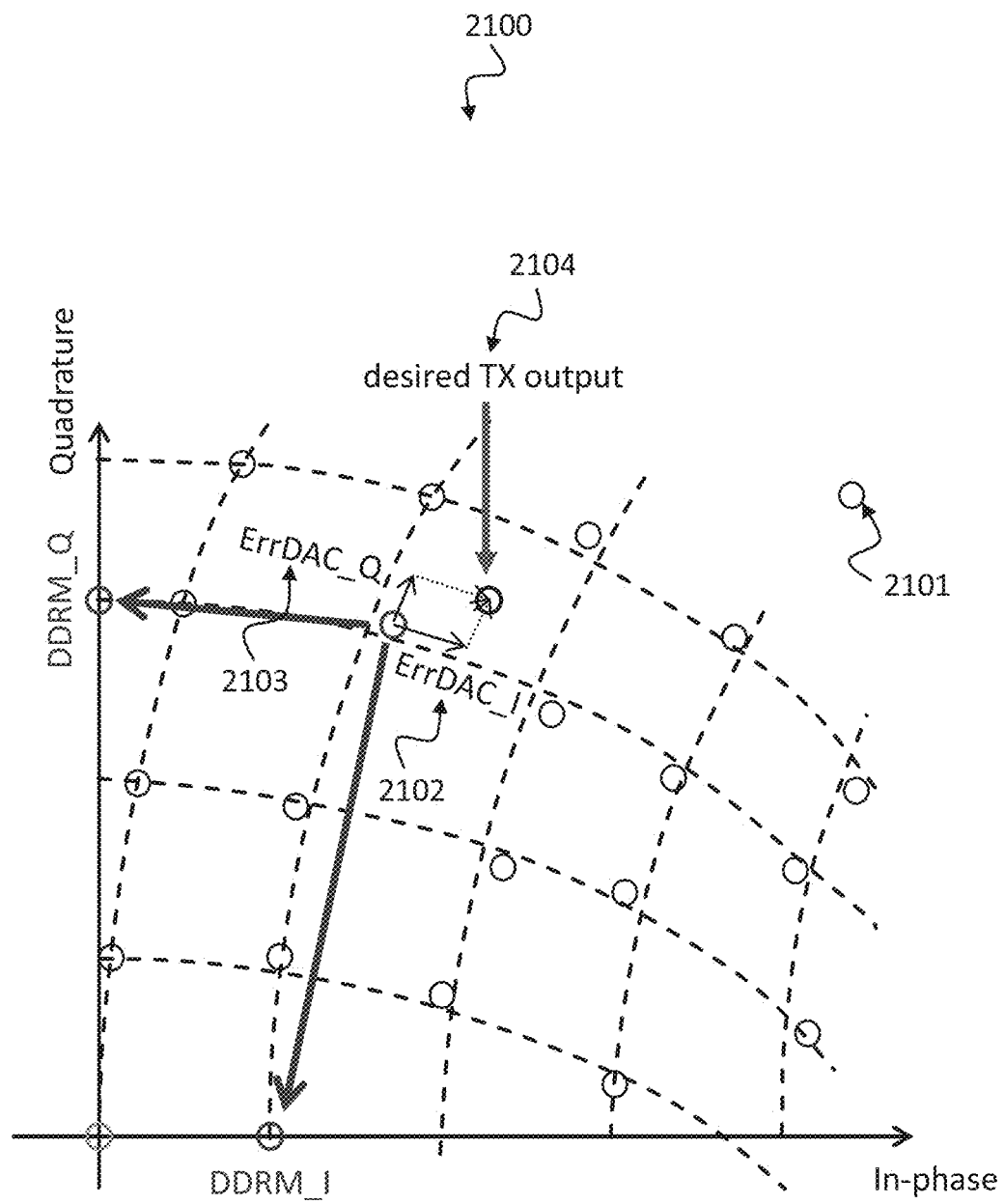
FIG. 21 shows a constellation diagram illustrating a High-level ErrDAC input value calculation algorithm according to an implementation form.

FIG. 21 shows a constellation diagram illustrating a High-level ErrDAC input value calculation algorithm 2100 according to an implementation form.

The constellation diagram illustrates a grid of DDRM constellation points 2101 affected by INL and compression. A desired TX output point 2104 can be computed by applying an inphase component ErrDAC_I 2102 and a quadrature component ErrDAC_Q 2103 to a DDRM constellation point 2101.

At any given time the combination of DDRM and ErrorDac generates a "desired TX output" 2104. The algorithm used to achieve this can be described as follows: 1. find the DDRM state that brings you as close as possible to the desired output point 2104 ([DDRM_I, DDRM_Q]); 2. calculate the residual error; and 3. Feed the residual error into the ErrorDac control.

In order for this to work the residual error for each state has to be known. As the DDRM is built from slices it is sufficient to characterize a subset of states that cover all slices in order to be able to calculate the residual errors.

The algorithm takes into account the fact that part of the nonlinearity mechanisms operate on the output of the system after adding the main DDRM and ErrorDac outputs together. Hence the correction value should be calculated on the signal before the output linearity is applied. This is automatically achieved if the slices are characterized individually using low output swing test signals and if the resulting weights are then linearly added to construct the predicted signal before output distortion.

Figure 22:
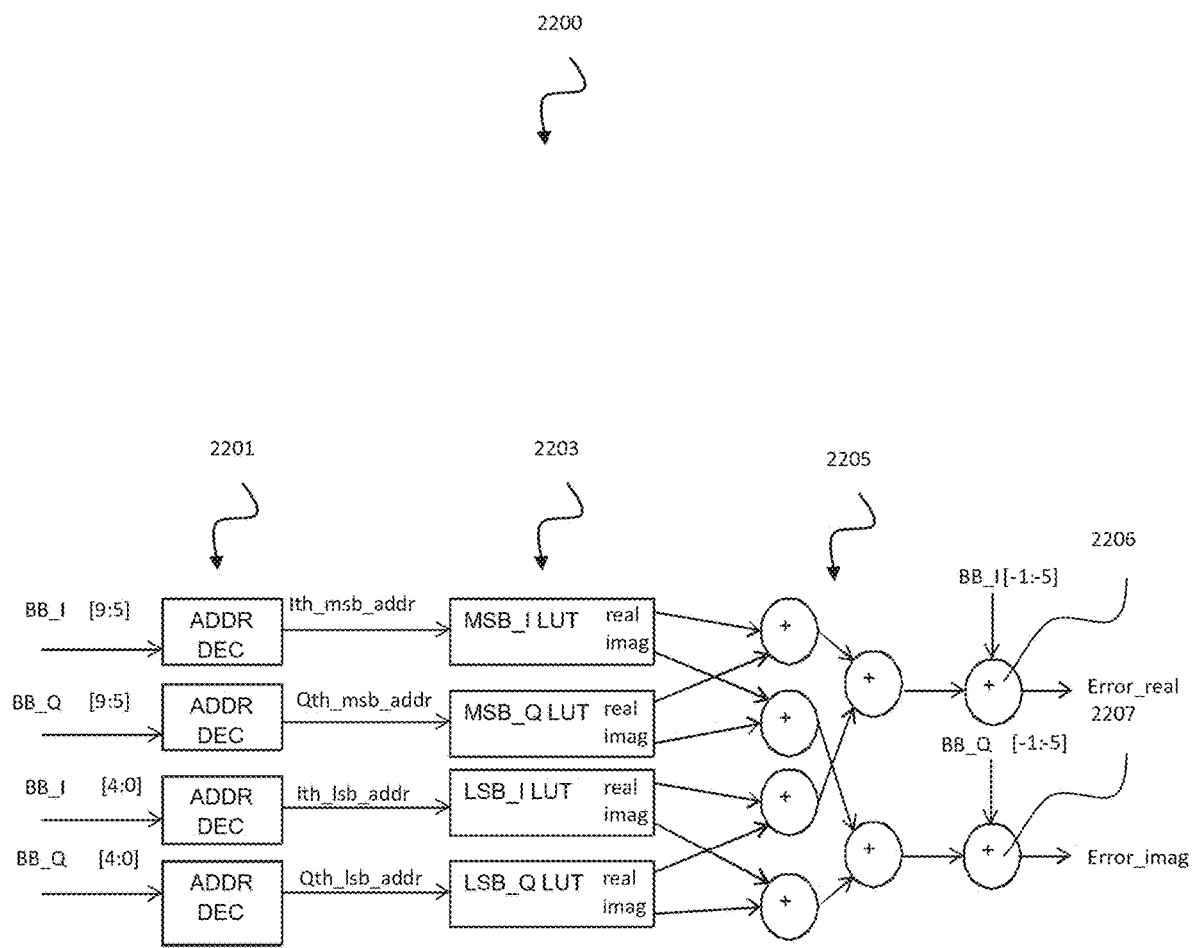
FIG. 22 shows a block diagram illustrating an exemplary error vector estimation of the High-level ErrDAC input value calculation algorithm of FIG. 21.

FIG. 22 shows a block diagram illustrating exemplary error vector estimation 2200 of the High-level ErrDAC input value calculation algorithm 2100 of FIG. 21.

From the baseband input signal the specific set of slices enabled in a DDRM at any given time can be determined. This information can then be used to calculate the error generated by that specific DDRM state. The calculated value can then be converted into an appropriate signal for the ErrorDAC.

FIG. 22 illustrates this for a 10-bit quadrature DDRM that is split into an in-phase and quadrature DDRM. Each of these DDRMs is split into a 5-bit MSB section and a 5-bit LSB section.

From the top 5 bits the configuration of the MSB section can be determined 2201 for both, the I and Q DDRM. These bits can be used as addresses for a lookup table 2203 that contains the measured error for the state corresponding to a given address. The error vector can have any angle and hence the output of the LUT is a complex number.

Such a computation can be done for all segments in the DDRM resulting in an error vector for each of the segments. These vectors can then be summed 2206, 2207 into one complex error vector and used as input to the error DAC encoder.

Figure 23:
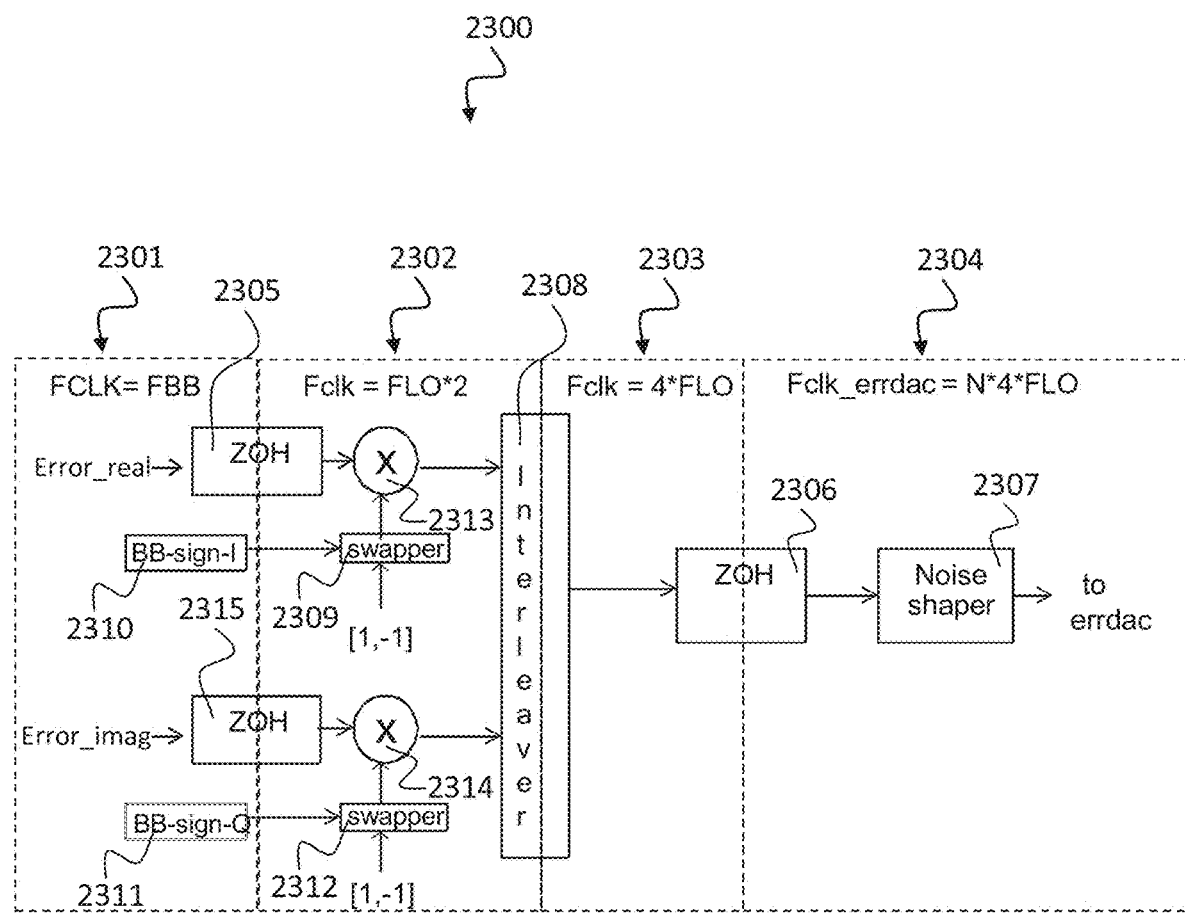
FIG. 23 shows a block diagram illustrating an exemplary ErrDAC input data generation of the High-level ErrDAC input value calculation algorithm of FIG. 21.

FIG. 23 shows a block diagram illustrating an exemplary ErrDAC input data generation 2300 of the High-level ErrDAC input value calculation algorithm 2100 of FIG. 21.

The error vector calculated in the previous step is dependent on the state of the DDRM and hence will be constant for one baseband period 2301. It can therefore be upconverted to the LO frequency by a sequence of a zeroth order hold 2305, 2315 and a multiplication 2313, 2314 with the [1, −1] sequence at a sample rate of 2*FLO 2302.

The error vector is calculated based upon the absolute value of the DDRM amplitude vectors. In order to account for the phase of the effective DDRM output vector the mixing sequence in the multiplication may be swapped 2309, 2312 depending on the value of the sign.

After digital mixing 2313, 2314, the real and imaginary signals can be interleaved 2308 to form an equivalent stream at 4*FLO 2303. This sequence is then again upsampled using a zeroth order hold 2306 and fed into a noise shaping bit-width reducer 2307 running at a sample rate 2304 that is a multiple of 4*FLO, the latter also being the sample rate of the High-speed DAC. An example noise shaper is shown in FIG. 24.

Figure 24:
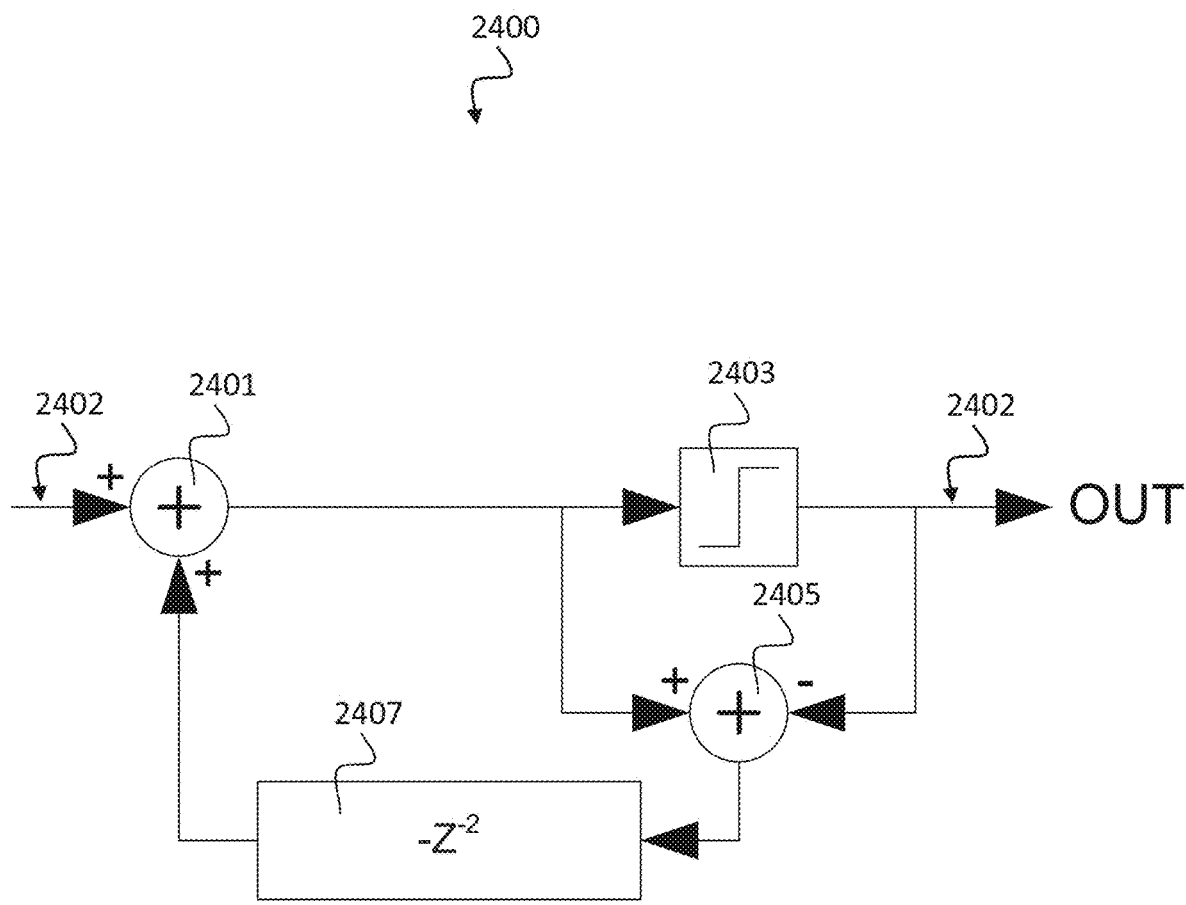
FIG. 24 shows a block diagram illustrating an exemplary noise shaper that may be used in the error compensation path of the error-compensated direct digital modulation device of FIG. 8 or the DDRM of FIG. 11 according to an implementation form.

FIG. 24 shows a block diagram illustrating an exemplary noise shaper 2400 that may be used in the error compensation path of the error-compensated direct digital modulation device 800 of FIG. 8 or the DDRM of FIG. 11 according to an implementation form.

Input signal 2402 is provided to a first adder 2401 together with output signal of delay element $-Z^{-2}$, 2407. Output of first adder 2402 is provided to quantizer 2403 and second adder 2405. An inverse Output of quantizer 2403 is provided to second adder 2402 which output is provided to delay element $-Z^{-2}$, 2407. Output (OUT), 2403 of quantizer 2403 is output of the noise shaper 2400. The quantizer 2403 may output two quantization levels.

In this example, the ErrorDAC quantization noise is shaped with a zero at Fsample/4 (hence a zero at FLO for a noise-shaper sampled at 4*FLO), meaning that the residual noise of the entire system will be low close to FLO.

The concept according to the disclosure can be generally applied for improving the accuracy of data-converted signals, for example analog signals generated by Digital-to-Analog converters or output signals of other data converters. The concept is not limited to an RF signal that is output from a DDRM. An application of this concept to SAR ADCs is described below with respect to FIG. 25.

Figure 25:
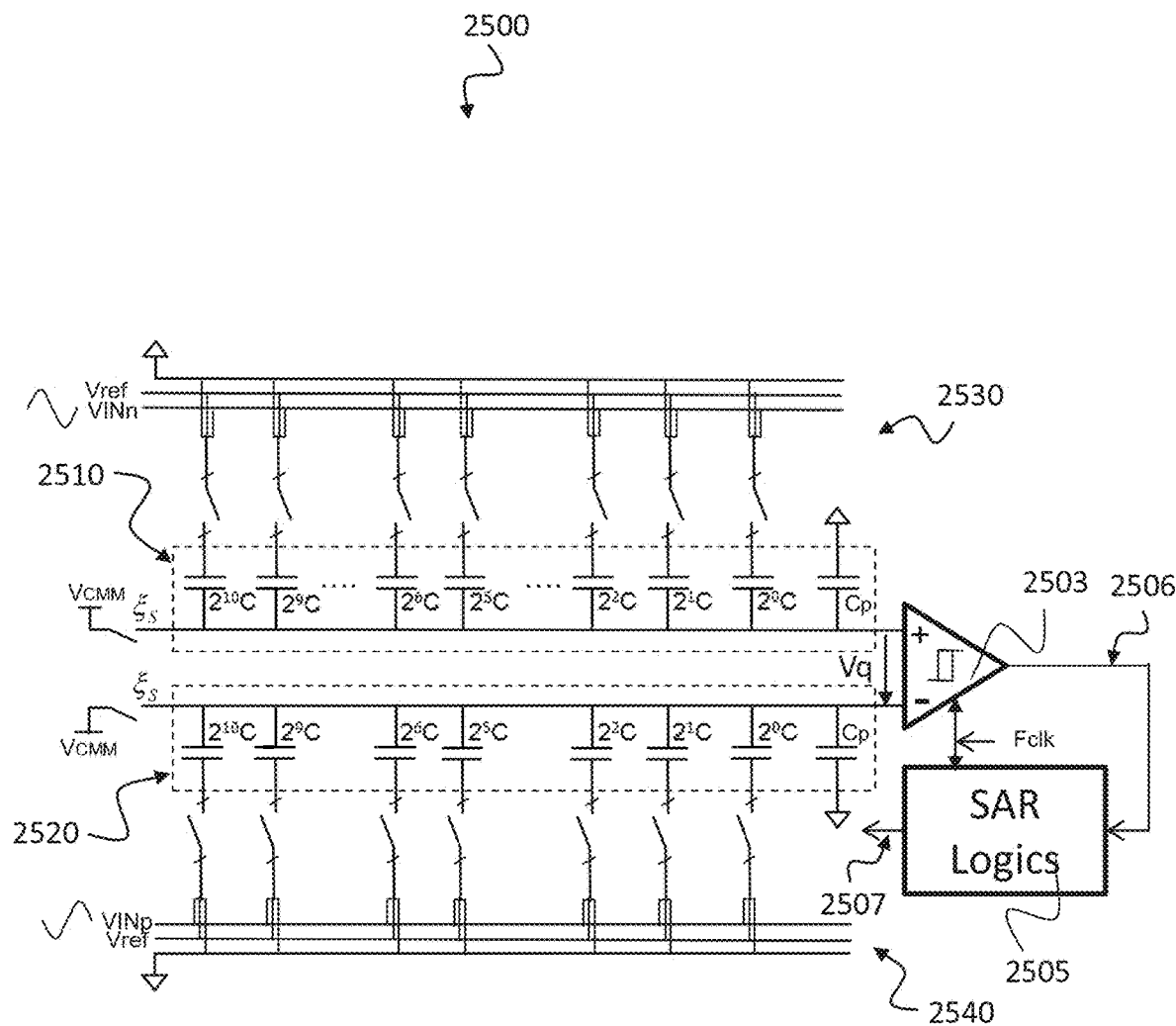
FIG. 25 shows a schematic diagram illustrating a SAR ADC applying an error compensation technique according to the disclosure.

Techniques according to the disclosure may be applied for improving SAR ADCs, e.g. as depicted in FIG. 25. Successive-approximation-register (SAR) analog-to-digital converters (ADCs) are frequently used for medium-to-high-resolution applications with sample rates under tens of megasamples per second (Msps). Resolution for SAR ADCs most commonly ranges from 8 to 16 bits and they provide low power consumption The SAR ADC basically implements a binary search algorithm. Therefore, while the internal circuitry may be running at several megahertz (MHz), the ADC sample rate is a fraction of that number due to the successive-approximation algorithm.

The basic architecture of a SAR ADC 2500 is shown in FIG. 25. The SAR ADC includes a first capacitor line 2510 and a second capacitor line 2520 which are each connected to a respective terminal of a comparator 2503. The capacitor lines 2510, 2520 implement capacitive DACs and each one includes an array of N capacitors with binary weighted values. For each of the capacitive DACs 2510, 2520 an ErrorDAC compensation path 1003 as described above with respect to FIG. 10 can be applied to improve the accuracy of the respective capacitor line.

Cp denotes the parasitic capacitance on the input of the comparator. FIG. 25 shows an example of a 12-bit capacitive DAC connected to a comparator 2503. During the acquisition phase, the array's common terminal (the terminal at which all the capacitors share a connection, see FIG. 25) is connected to VCMM where VCMM is a common-mode voltage and all free terminals are connected to the input signal (analog in or VIN). After acquisition, the common terminal is disconnected from VCMM and the free terminals are disconnected from VIN, thus effectively trapping a charge proportional to the input voltage on the capacitor array. The free terminals of all the capacitors are then connected to ground, driving the terminal of 2510 to VCMM−VINn and the terminal of 2520 to VCMM−VINp. Hence the input of the comparator is Vq=VIN=VINp−VINn.

As the first step in the binary search algorithm, the input of the comparator Vq=VIN. The comparator output 106 yields a logic 1 if Vq>0 (i.e., VIN>0). The comparator output 2506 yields logic 0 if VIN<0. If the comparator output 2506 at the end of the first step is logic 1, at the second step in the binary search algorithm, the bottom plate of the MSB capacitor in 2520 is disconnected from ground and connected to VREF. This drives the comparator input in the negative direction by an amount equal to −½VREF. Therefore, Vq=VIN−½×VREF. The comparator output 2506 yields a logic 1 if VCOMMON>0 (i.e., VIN>½× VREF). The comparator output 2506 yields logic 0 if VIN<½×VREF.

Alternatively, if the comparator output 2506 at the end of the first step is logic 0, at the second step in the binary search algorithm, the bottom plate of the MSB capacitor in 2510 is disconnected from ground and connected to VREF. This drives the comparator input in the positive direction by an amount equal to +½VREF. Therefore, Vq=VIN+½×VREF. The comparator output 2506 yields a logic 1 if Vq>0 (i.e., VIN>−½×VREF). The comparator output 2506 yields logic 0 if VIN<−½×VREF.

Same procedure is repeated for the bottom plate of the next smaller capacitors until all the bits have been determined. In general, the input of the comparator converges to zero i.e. Vq will be almost zero at the end of the comparison time.

When applying for each of the capacitive DACs 2510, 2520 an ErrorDAC compensation path 1003 as described above with respect to FIG. 10 the accuracy of the whole SAR ADC 2500 can be improved.

The present disclosure also supports a computer program product including computer executable code or computer executable instructions that, when executed, causes at least one computer to execute the performing and computing steps described herein, in particular the steps of the method 900 described above with respect to FIG. 9. Such a computer program product may include a readable non-transitory storage medium storing program code thereon for use by a computer. The program code may perform the method 900 described above with respect to FIG. 9.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the invention beyond those described herein. While the present invention has been described with reference to one or more particular embodiments, those skilled in the art recognize that many changes may be made thereto without departing from the scope of the present invention. It is therefore to be understood that within the scope of the appended claims and their equivalents, the invention may be practiced otherwise than as specifically described herein.

What is claimed is:

1. A device, comprising:
   a direct digital radio frequency modulator (DDRM), configured to perform direct digital frequency modulation on a digital baseband signal to generate a frequency modulated signal of the digital baseband signal, the frequency modulated signal being a radio frequency (RF) signal;
   an error estimator, configured to determine an error generated by the DDRM in performing the direct digital frequency modulation on the digital baseband signal, thereby generating a baseband error signal, the error comprising an estimation of a deviation between the RF signal and a representation of the digital baseband signal having a higher resolution than the digital baseband signal, and the deviation corresponding to at least one error between constellation points generated by the DDRM from the digital baseband signal and ideal constellation points associated with the digital baseband signal; and
   an error compensator, configured to subtract the baseband error signal from the RF signal to provide an error compensated RF signal.

2. The device of claim 1, wherein the error estimator is configured to determine the error based on a quantization error between the digital baseband signal and the RF signal.

3. The device of claim 2, wherein the error estimator is configured to determine the quantization error based on Least Significant Bits (LSBs) in the digital baseband signal that are not used by the DDRM.

4. The device of claim 1, wherein the error estimator is configured to determine the error based on a mismatch error resulting from a systematic deviation of the DDRM from its nominal output signal characteristic.

5. The device of claim 4, wherein the mismatch error corresponds to a known deviation of a signal constellation used by the DDRM from its nominal signal pattern.

6. The device of claim 1, wherein:
   the DDRM is configured to generate an analog RF signal; and
   the error estimator is configured to determine the baseband error signal resulting from another deviation based on the generated analog RF signal and an analog representation of the digital baseband signal.

7. The device of claim 1, further comprising:
   a digital-to-analog converter (DAC), configured to provide the baseband error signal as an analog baseband error signal; or
   a second DDRM, configured to provide the baseband error signal as the analog baseband error signal.

8. The device of claim 7, further comprising:
a noise shaper, configured to noise shape the baseband error signal before providing it to the DAC or the second DDRM.

9. The device of claim 7, wherein the DAC or the second DDRM is configured to operate on a sample rate that is higher than a local oscillator (LO) frequency of the DDRM.

10. The device of claim 7, wherein:
the DAC or the second DDRM is configured to provide the baseband error signal using a first clock signal; and
the DDRM is configured to modulate the digital baseband signal using a second clock signal that is derived from the first clock signal.

11. The device of claim 10, further comprising:
a quadrature clock generator configured to generate a first differential input clock signal and a second differential input clock signal based on the second clock signal, wherein the first differential input clock signal and the second differential input clock signal have orthogonal phases.

12. The device of claim 11, wherein the DDRM comprises:
a first sign swapper configured to swap a first phase of the first differential input clock signal based on a first control signal; and
a second sign swapper configured to swap a second phase of the second differential input clock signal based on a second control signal.

13. The device of claim 11, wherein the DDRM comprises:
a first direct digital RF amplitude modulator configured to generate a first differential current based on a first magnitude control signal derived from the digital baseband signal and based on the first differential input clock signal;
a second direct digital RF amplitude modulator configured to generate a second differential current based on a second magnitude control signal derived from the digital baseband signal and based on the second differential input clock signal; and
a controller configured to provide the first magnitude control signal and the second magnitude control signal based on the digital baseband signal.

14. The device of claim 13, further comprising:
a signal combiner, configured to combine the first differential current, the second differential current and an inverse differential current generated by the DAC or the second DDRM to provide the error compensated RF signal.

15. The device of claim 1, wherein the representation of the digital baseband signal is an analog representation of the digital baseband signal.

16. A method, comprising:
performing direct digital frequency modulation on a digital baseband signal to generate a frequency modulated signal of the digital baseband signal using a direct digital radio frequency modulator (DDRM), the frequency modulated signal being a radio frequency (RF) signal;
determining an error generated by the DDRM in performing the direct digital frequency modulation on the digital baseband signal, thereby generating a baseband error signal, the error comprising an estimation of a deviation between the RF signal and a representation of the digital baseband signal having a higher resolution than the digital baseband signal, and the deviation corresponding to at least one error between constellation points generated by the DDRM from the digital baseband signal and ideal constellation points associated with the digital baseband signal; and
subtracting the baseband error signal from the RF signal to provide an error compensated RF signal.

17. The method of claim 16, wherein determining the error is based on a quantization error between the digital baseband signal and the RF signal.

18. The method of claim 17, further comprising:
determining the quantization error based on Least Significant Bits (LSB) in the digital baseband signal that are not used by the DDRM.

19. The method of claim 16, wherein determining the error is based on a mismatch error resulting from a systematic deviation of the DDRM from its nominal output signal characteristic.

20. The method of claim 19, wherein the mismatch error corresponds to a known deviation of a signal constellation used by the DDRM from its nominal signal pattern.

21. The method of claim 16, further comprising:
noise shaping the baseband error signal.

* * * * *